(12) United States Patent
Maekawa et al.

(10) Patent No.: US 10,325,899 B2
(45) Date of Patent: Jun. 18, 2019

(54) SEMICONDUCTOR DEVICE INCLUDING TRANSISTORS FORMED IN REGIONS OF SEMICONDUCTOR SUBSTRATE AND OPERATION METHOD OF THE SAME

(71) Applicant: Renesas Electronics Corporation, Tokyo (JP)

(72) Inventors: Keiichi Maekawa, Tokyo (JP); Hideaki Yamakoshi, Tokyo (JP); Shinichiro Abe, Tokyo (JP); Hideki Makiyama, Tokyo (JP); Tetsuya Yoshida, Tokyo (JP); Yuto Omizu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/880,212

(22) Filed: Jan. 25, 2018

(65) Prior Publication Data
US 2018/0286850 A1    Oct. 4, 2018

(30) Foreign Application Priority Data

Mar. 28, 2017    (JP) .................................. 2017-062203

(51) Int. Cl.
| | |
|---|---|
| *G11C 16/04* | (2006.01) |
| *H01L 27/02* | (2006.01) |
| *G11C 16/12* | (2006.01) |
| *H01L 27/1157* | (2017.01) |
| *G11C 16/10* | (2006.01) |
| *G11C 16/14* | (2006.01) |

(Continued)

(52) U.S. Cl.
CPC ...... *H01L 27/0207* (2013.01); *G11C 16/0466* (2013.01); *G11C 16/10* (2013.01); *G11C 16/12* (2013.01); *G11C 16/14* (2013.01); *H01L 21/28282* (2013.01); *H01L 27/1157* (2013.01); *H01L 27/11573* (2013.01); *H01L 29/4234* (2013.01); *H01L 29/66833* (2013.01); *H01L 29/792* (2013.01); *G11C 16/0433* (2013.01)

(58) Field of Classification Search
CPC . H01L 27/0207; H01L 27/1157; G11C 16/12; G11C 16/0466
See application file for complete search history.

(56) References Cited

U.S. PATENT DOCUMENTS

| | | | |
|---|---|---|---|
| 7,118,972 B2 | 10/2006 | Shinohara et al. | |
| 8,058,680 B2 * | 11/2011 | Io ..................... | H01L 21/28273 257/315 |

(Continued)

FOREIGN PATENT DOCUMENTS

| | | |
|---|---|---|
| JP | 2004-349680 A | 12/2004 |

*Primary Examiner* — Khamdan N. Alrobaie
(74) *Attorney, Agent, or Firm* — McGinn I.P. Law Group, PLLC.

(57) ABSTRACT

To make a gate insulating film of a selecting transistor coupled in series to a MONOS memory transistor thinner and to ensure insulation resistance of the gate insulating film, the selecting transistor and the memory transistor, which constitute a memory cell, are formed on an SOI substrate, and an extension region of the selecting transistor is formed to be away from a selecting gate electrode in a plan view. A drain region of the selecting transistor and a source region of the memory transistor share the same semiconductor region with each other.

15 Claims, 23 Drawing Sheets

(51) Int. Cl.
*H01L 21/28* (2006.01)
*H01L 29/423* (2006.01)
*H01L 29/66* (2006.01)
*H01L 29/792* (2006.01)
*H01L 27/11573* (2017.01)

(56) References Cited

U.S. PATENT DOCUMENTS

| | | | |
|---|---|---|---|
| 9,245,961 B1* | 1/2016 | Wu | H01L 21/027 |
| 2008/0251834 A1* | 10/2008 | Yaegashi | H01L 27/105 |
| | | | 257/316 |
| 2014/0024186 A1* | 1/2014 | Yoo | H01L 21/28211 |
| | | | 438/275 |
| 2014/0353740 A1* | 12/2014 | Nishida | H01L 21/823814 |
| | | | 257/326 |
| 2015/0255287 A1* | 9/2015 | Shoji | H01L 21/266 |
| | | | 438/514 |
| 2015/0318293 A1* | 11/2015 | Lee | H01L 27/11529 |
| | | | 257/392 |
| 2016/0284720 A1* | 9/2016 | Ema | H01L 27/11573 |

* cited by examiner

FIG. 22

|  |  | WL1 | WL2 | BL1 | BL2 | SL1 | SL2 | Sub |
|---|---|---|---|---|---|---|---|---|
| Write | A | 6.5V | 0V | -2.5V | 2.0V | -2.5V | 2.0V | 0V |
|  | B | 6.5V | -2.5V | -2.5V | 2.0V | -2.5V | -2.5V | 0V |
|  | C | 6.5V | 0V | -2.5V | 2.0V | -2.5V | -2.5V | -2.5V |
|  | D | 6.5V | -2.5V | -2.5V | 2.0V | -2.5V | 2.0V | -2.5V |
| Erase | E | -2.5V | 0V | 6.5V | 6.5V | 0V | 0V | 0V |

SEMICONDUCTOR DEVICE INCLUDING TRANSISTORS FORMED IN REGIONS OF SEMICONDUCTOR SUBSTRATE AND OPERATION METHOD OF THE SAME

CROSS-REFERENCE TO RELATED APPLICATIONS

The disclosure of Japanese Patent Application No. 2017-062203 filed on Mar. 28, 2017 including the specification, drawings and abstract is incorporated herein by reference in its entirety.

BACKGROUND

The present invention relates to a semiconductor device and an operating method of the same, and particularly relates to a technique that is effective when being applied to a semiconductor device including a MONOS memory.

A single-gate MONOS (Metal Oxide Nitride Oxide Semiconductor) memory is known as one of known non-volatile memory elements. The single-gate MONOS memory includes source and drain regions formed in a surface of a semiconductor substrate, a memory gate electrode, and a charge storage film formed between the semiconductor substrate and the memory gate electrode. In a non-volatile memory device, such MONOS memories are arranged in an array to configure a memory array in which selection of a MONOS memory in a read operation and the like can be performed by using a selecting transistor coupled in series to each MONOS memory, for example.

Japanese Unexamined Patent Application Publication No. 2004-349680 describes forming a low breakdown voltage MIS (Metal Insulator Semiconductor) transistor, a high breakdown voltage MIS transistor, a MONOS transistor, and a MIS transistor for memory selection. In this description, gate insulating films of the high breakdown voltage MIS transistor and the MIS transistor for memory selection are formed by the same insulating film.

SUMMARY

When the gate insulating film of the selecting transistor is made thin in order to achieve reduction of a driving voltage and reduction of power consumption of an element, there is a problem that, in the selecting transistor, a breakdown voltage cannot be ensured between the gate electrode and the source and drain regions.

Other objects and novel features will be apparent from the description of this specification and the accompanying drawings.

The summary of a typical one of embodiments disclosed in the present application is briefly described below.

A semiconductor device according an embodiment includes a first transistor, a fourth transistor that is driven by a higher voltage than that of the first transistor, and a selecting transistor and a memory transistor that are coupled to each other in series, a thickness of a second gate electrode of the selecting transistor being thinner than a thickness of a fourth gate electrode of the fourth transistor. The selecting transistor and the memory transistor are formed on an SOI substrate, and a drain region of the selecting transistor is away from a selecting gate electrode in a plan view.

An operating method of a semiconductor device according to another embodiment, which includes a first transistor, a fourth transistor that is driven by a higher voltage than that of the first transistor, and a selecting transistor and a memory transistor that are formed on an SOI substrate and are coupled to each other in series, applies a voltage with an opposite polarity to that of a voltage applied to a selecting gate electrode of the selecting transistor, to a semiconductor substrate in a write operation. A thickness of a second gate electrode of the selecting transistor is thinner than a thickness of a fourth gate insulating film of the fourth transistor, and a drain region of the selecting transistor is away from the selecting gate electrode in a plan view.

According to an embodiment disclosed in the present application, it is possible to improve reliability of a semiconductor device. In particular, the breakdown voltage of a selecting transistor can be ensured.

BRIEF DESCRIPTION OF THE DRAWINGS

FIG. 22 illustrates a table showing conditions for applying a voltage to each portion of a selected memory cell in each of semiconductor devices according to the first to fourth embodiments.

DETAILED DESCRIPTION

Figure 1:
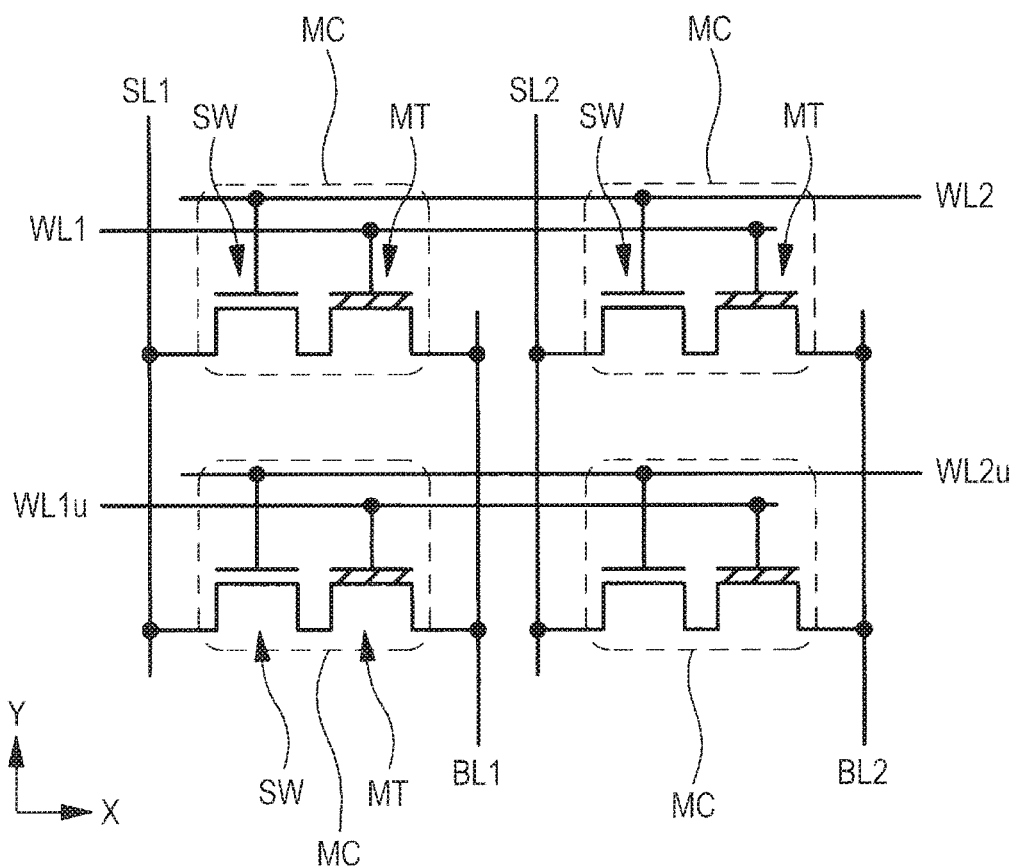
FIG. 1 is a circuit diagram illustrating a memory cell array constituting a semiconductor device according to a first embodiment of the present invention.

The following embodiments will be described while being divided into a plurality of sections or embodiments, if necessary for the sake of convenience. However, unless otherwise specified, these are not independent of each other, but are in a relation such that one is a modification example, details, complementary explanation, or the like of a part or the whole of the other. In the following embodiments, when a reference is made to the number of elements and the like (including number, numerical value, quantity, range, or the like), the number of elements is not limited to the number to which the reference is made, but may be that number or more or that number or less, unless otherwise specified, or except the case where the number is apparently limited to a specific number in principle, or except for other cases. Further, in the following embodiments, the constitutional elements (including element steps or the like) are not always essential, unless otherwise specified, or except the case where they are apparently considered essential in principle, or except for other cases. Similarly, in the following embodiments, when a reference is made to the shapes, positional relationships, or the like of the constitutional elements or the like, it is understood that they include ones substantially analogous or similar to the shapes or the like, unless otherwise specified, or unless otherwise considered apparently in principle, or except for other cases. This also applies to the foregoing numerical value and range.

Embodiments are described in detail below, with reference to the drawings. Throughout the drawings for explaining the embodiments, components having the same function are labeled with the same reference sign and repetition of the description is omitted. In the following embodiments, the description of the same or similar portion is not repeated in principle unless particularly necessary.

A semiconductor device of the present invention is a semiconductor device including a non-volatile memory (a non-volatile memory element, a flash memory, or a non-volatile semiconductor memory device). The non-volatile memory described here is a single-gate MONOS memory (hereinafter, simply referred to as a MONOS memory). In the following embodiments, the description refers to a memory cell that basically has the configuration of an n-channel MISFET (Metal Insulator Semiconductor Field Effect Transistor).

Polarities (a polarity of an applied voltage in each of writing, erasing, and reading and a polarity of a carrier) in the present application are for explaining an operation of a memory cell that basically has the configuration of an n-channel MISFET. In a case where a memory cell basically has the configuration of a p-channel MISFET, the same operation can be achieved in principle by reversing all the polarities of the applied voltage, the conductive type of the carrier, and the like.

In addition, mask in the present application refers to a protection film used for protecting some objects from etching (etching mask) or a protection film for protecting some objects from ion implantation (ion-implantation blocking mask).

First Embodiment

A semiconductor device of the present embodiment is directed to a non-volatile memory element, and is particularly directed to a non-volatile memory element in which a selecting transistor is coupled in series to a single-gate MONOS memory that includes a charge storage portion in a portion of a gate insulating film.

In the present embodiment, a memory transistor and the selecting transistor are formed on an SOI (Silicon On-Insulator) substrate, thereby preventing generation of leak current and breakdown in the selecting transistor in an erase operation. Further, in the present embodiment, source and drain regions shared by the selecting transistor and the memory transistor are arranged to be away from a gate electrode of the selecting transistor in a plan view, thereby preventing generation of the leak current and the breakdown in the selecting transistor in a write operation.

<Configuration of Semiconductor Device>

Figure 2:
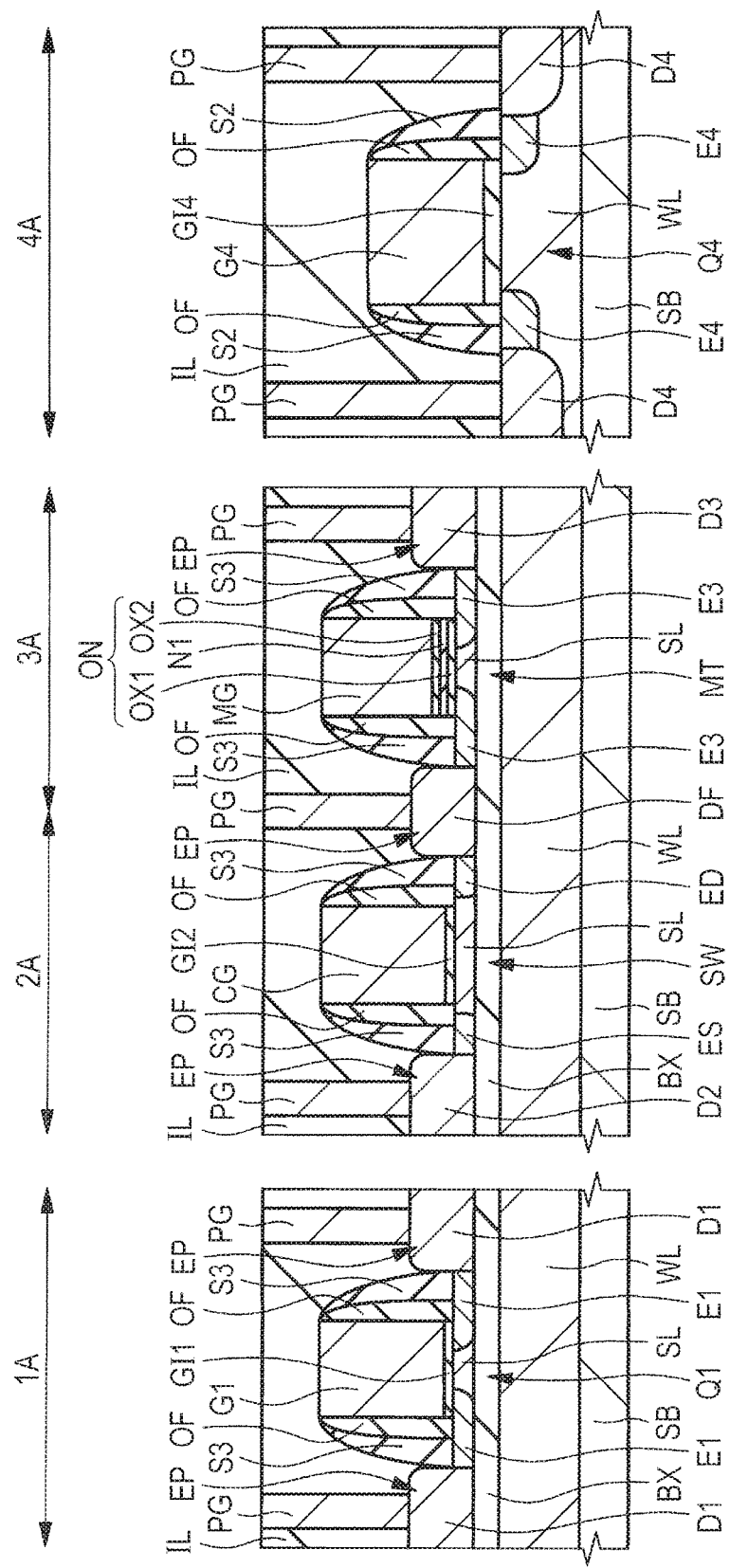
FIG. 2 is a cross-sectional view of the semiconductor device according to the first embodiment of the present invention.

The configuration of the semiconductor device of the present embodiment is described below, with reference to FIGS. 1 and 2. FIG. 1 is a circuit diagram illustrating a memory cell array formed by arranged memory cells each of which is a semiconductor device according to the present embodiment. FIG. 2 is a cross-sectional view of the semiconductor device of the present embodiment. As described below, the semiconductor device of the present embodiment has an array configuration in which a selecting transistor and a memory transistor that is a MONOS memory are arranged in series, and performs a write operation and an erase operation by injection of electrons/holes to an ONO film by a tunnel phenomenon caused by a potential difference between a word line and a bit line in a memory portion.

As illustrated in FIG. 1, the semiconductor device of the present embodiment includes a plurality of word lines (memory lines) WL1, WL1u, WL2, and WL2u, a plurality of selecting lines (source lines) SL1 and SL2, and a plurality of bit lines BL1 and BL2. The word lines WL1, WL1u, WL2, and WL2u extend in X-direction. Also, the word lines WL1, WL1u, WL2, and WL2u are arranged in a direction crossing X-direction, preferably in Y-direction perpendicular to X-direction. X-direction and Y-direction are directions along a main surface of a semiconductor substrate. The selecting lines SL1 and SL2 extend in Y-direction and are arranged in X-direction. The bit lines BL1 and BL2 extend in Y-direction and are arranged in X-direction.

The word lines WL1, WL1u, WL2, and WL2u and the bit lines BL1 and BL2 cross each other, and memory cells MC are respectively formed at crossings of the word lines WL1, WL1u, WL2, and WL2u and the bit lines BL1 and BL2. The selecting lines SL1 and SL2 and the word lines WL1, WL1u, WL2, and WL2u cross each other, and memory cells MC are respectively formed at crossings of the selecting lines SL1 and SL2 and the word lines WL1, WL1u, WL2, and WL2u. Therefore, the memory cells MC are arranged in a matrix in X-direction and Y-direction. In FIG. 1, each memory cell MC is surrounded with broken line.

The memory cell MC includes a selecting transistor (switching transistor) SW and a memory transistor MT. The selecting transistor SW and the memory transistor MT are coupled to each other in series. That is, a diffusion layer of the selecting transistor SW not coupled to the selecting line SL1 is coupled to a diffusion layer of the memory transistor MT not coupled to the bit line BL1. The memory transistor MT is a field effect transistor including a charge storage portion (charge storage film) in which charges are stored, and is a non-volatile memory element that allows information to be written thereto by storing charges in the charge storage portion and allows information to be erased therefrom by removing the charges in the charge storage portion.

In this description, a state where electrons are stored in the charge storage portion of the memory transistor MT and a threshold voltage of the memory transistor MT is raised is defined as a "write state", and a state where the electrons in the charge storage portion of the memory transistor MT are removed and the threshold voltage of the memory transistor MT is lowered is defined as an "erase state". In a read operation of the memory transistor MT, it is possible to determine the write state or the erase state of information by using a change of the threshold voltage of the memory cell transistor MT. In a write operation, writing is selectively for each memory cell MC (on a bit-by-bit basis). In an erase operation, writing is performed for the entire memory cell array at once.

The word line WL1 is coupled to a gate electrode (memory gate electrode) of each of the memory transistors MT of memory cells MC arranged in X-direction among four memory cells MC illustrated in FIG. 1. The word line WL1u is coupled to a gate electrode (memory gate electrode) of each of the memory transistors MT of the other memory cells MC among the four memory cells MC illustrated in FIG. 1. The other memory cells MC are arranged in Y-direction with respect to the memory cells MC to which the word line WL1 is coupled, and are arranged in X-direction.

The word line WL2 is coupled to a gate electrode (selecting gate electrode) of each of the selecting transistors SW of memory cells MC arranged in X-direction among the four memory cells MC illustrated in FIG. 1. The word line WL2u is coupled to a gate electrode (selecting gate electrode) of each of the selecting transistors SW of the other memory cells MC among the four memory cells MC illustrated in FIG. 1. The other memory cells MC are arranged in Y-direction with respect to the memory cells MC to which the word line WL2 is coupled, and are arranged in X-direction.

The selecting line SL1 is coupled to a source electrode of each of the selecting transistors SW of memory cells MC arranged in Y-direction among four memory cells MC illustrated in FIG. 1. The selecting line SL2 is coupled to a source electrode of each of selecting transistors SW of other memory cells MC among four memory cells MC illustrated in FIG. 1. The other memory cells MC are arranged in X-direction with respect to the memory cells MC to which the selecting line SL1 is coupled, and are arranged in Y-direction.

The bit line BL1 is coupled to a drain electrode of each of memory transistors MT of memory cells MC arranged in Y-direction among four memory cells MC illustrated in FIG. 1. The bit line BL2 is coupled to a drain electrode of each of memory transistors MT of other memory cells MC among four memory cells MC illustrated in FIG. 1. The other memory cells MC are arranged in X-direction with respect to the memory cells MC to which the bit line BL1 is coupled, and are arranged in Y-direction.

Next, the configuration of the semiconductor device of the present embodiment is described with reference to FIG. 2. In FIG. 2, a low breakdown voltage transistor region 1A, a selecting transistor region 2A, a memory transistor region 3A, and a high breakdown voltage transistor region 4A are illustrated in that order from left.

A low breakdown voltage transistor Q1 is formed in the low breakdown voltage transistor region 1A, which is a MIS (Metal Insulator Semiconductor) field effect transistor (FET) driven by a relatively low voltage and formed in a peripheral circuit region (core region), for example. In the following description, a MIS field effect transistor is simply referred to as a MISFET. A selecting transistor SW, which is a MISFET constituting one of the memory cells MC described with reference to FIG. 1, is formed in the selecting transistor region 2A. A memory transistor MT, which constitutes one of the memory cells MC described with reference to FIG. 1, is formed in the memory transistor region 3A. A high breakdown voltage transistor Q4 is formed in the high breakdown voltage transistor region 4A, which is a MISFET formed in an I/O region and driven by a relatively high voltage, for example.

The peripheral circuit region is a region provided with a circuit configured by an element that is required to operate at a higher speed with lower power consumption, for example, as compared with an element in the I/O region. The I/O region is a region provided with a circuit that performs input and output between a semiconductor device and the outside of the semiconductor device, for example, or is a region provided with a circuit that supplies a relatively high voltage to a memory cell MC, for example. Therefore, the high breakdown voltage transistor Q4 has to have higher breakdown voltage characteristics, as compared with the low breakdown voltage transistor Q1.

As illustrated in FIG. 2, the semiconductor device of the present embodiment includes a semiconductor substrate SB, for example, formed of single-crystal Si (silicon). A well WL, which is a p-type semiconductor region with p-type impurities (e.g., B (boron)) introduced thereto, is formed on a main surface (top surface) of the semiconductor substrate SB. The wells WL respectively formed in the low breakdown voltage transistor region 1A, the selecting transistor region 2A, the memory transistor region 3A, and the high breakdown voltage transistor region 4A may have different impurity concentrations from one another.

A BOX (Buried Oxide) film BX and a semiconductor layer (SOI layer) SL that is formed of Si (silicon) are formed in that order on the main surface of the semiconductor substrate SB in the low breakdown voltage transistor region 1A, the selecting transistor region 2A, and the memory transistor region 3A. The BOX film BX and the semiconductor layer SL are not formed immediately above the semiconductor substrate SB in the high breakdown voltage transistor region 4A. The main surface of the semiconductor substrate SB in the high breakdown voltage transistor region 4A is exposed from the BOX film BX and the semiconductor layer SL.

In other words, the semiconductor substrate SB, the BOX film BX, and the semiconductor layer SL in the low breakdown voltage transistor region 1A, the selecting transistor region 2A, and the memory transistor region 3A form an SOI substrate, and the semiconductor substrate SB in the high breakdown voltage transistor region 4A forms a bulk silicon substrate. That is, the low breakdown voltage transistor region 1A, the selecting transistor region 2A, and the memory transistor region 3A that have the SOI substrate is an SOI region. The bulk silicon substrate in this description refers to a silicon substrate that does not have the SOI structure.

Because of the presence/absence of the BOX film BX and the semiconductor layer SL, a step is formed between each of the low breakdown voltage transistor region 1A, the selecting transistor region 2A, and the memory transistor region 3A, and the high breakdown voltage transistor region 4A. From a viewpoint of minimizing this step, it is desirable to employ an FDSOI structure in the SOI region. The FDSOI (Fully Depleted SOI) structure means a fully depleted SOI structure in which a depletion layer is formed from the top surface to the bottom surface of a semiconductor layer (SOI layer) that is a channel region during an operation of a transistor on the SOI substrate. Therefore, an extension region and a diffusion layer forming source and drain regions of the transistor on the SOI substrate having the FDSOI structure are formed from the top surface to the bottom surface of the semiconductor layer. This structure can be achieved by reducing the thickness of the semiconductor layer on the BOX film. In the present embodiment, the thickness of the semiconductor layer is 20 nm or less, for example, and is specifically some dozen nm.

One of main features of the present embodiment is that the low breakdown voltage transistor Q1, the selecting transistor SW, and the memory transistor MT are formed on the SOI substrate, and the high breakdown voltage transistor Q4 is formed on the bulk silicon substrate. That is, the source and drain regions of each of the low breakdown voltage transistor Q1, the selecting transistor SW, and the memory transistor MT are formed on the top surface of the semiconductor layer SL, and the source and drain regions of the high breakdown voltage transistor Q4 are formed on the top surface of the semiconductor substrate SB. Further, channels of the selecting transistor SW and the memory transistor MT are formed on the top surface of the semiconductor layer SL during an operation of each of the low breakdown voltage transistor Q1, the selecting transistor SW, and the memory transistor MT, and a channel of the high breakdown voltage transistor Q4 is formed on the top surface of the semiconductor substrate SB during an operation of the high breakdown voltage transistor Q4.

The low breakdown voltage transistor Q1 is isolated from other transistors by an element isolation region, although not illustrated. Similarly, the high breakdown voltage transistor Q4 is isolated from other transistors by the element isolation region. However, the selecting transistor SW and the memory transistor MT that form one memory cell are not isolated from each other by the element isolation region. The element isolation region is formed by an insulating film (e.g., a silicon oxide film) that extends through the semiconductor layer SL and the BOX film BX to reach a middle depth of the semiconductor substrate SB, for example. Further, in addition to the low breakdown voltage transistor Q1 that is an n-type transistor, a low breakdown voltage transistor that is a p-type transistor is formed in the peripheral circuit region, although not illustrated.

The BOX film BX is formed by a silicon oxide film, for example. The thickness of the BOX film BX is 30 nm or less, for example, and is specifically 15 nm, for example. The thickness of the semiconductor layer SL is 20 nm or less, for example, and is specifically some dozen nm.

In the low breakdown voltage transistor region 1A, a gate electrode G1 is formed on the semiconductor layer SL via a gate insulating film GI1. The gate insulating film GI1 is formed by a silicon oxide film, for example. A pair of source and drain regions is formed in the top surface of the semiconductor layer SL to sandwich the semiconductor layer SL directly below the gate electrode G1. In other words, the gate electrode G1 is formed directly above the semiconductor layer SL between the source region and the drain region formed in the semiconductor layer SL. The thickness of the gate insulating film GI1 is 3 nm, for example.

In the low breakdown voltage transistor region 1A, each of the source region and the drain region has an extension region E1 and a diffusion region D1. The extension region E1 and the diffusion region D1 are n-type semiconductor regions into which n-type impurities (e.g., As (arsenic) or P (phosphorus)) are introduced. The impurity concentration of the extension region E1 is lower than that of the diffusion region D1. In a gate-length direction, the extension region E1 is formed at a position closer to the gate electrode G1 than the diffusion region D1. The top surface of the semiconductor layer SL directly below the gate electrode G1 in a region sandwiched by the extension region E1 forming the source region and the extension region E1 forming the drain region is a region where a channel is formed in an operation of the low breakdown voltage transistor Q1. As described above, a source-drain extension structure is employed, in which the source and the drain regions are formed by the extension regions E1 and the diffusion regions D1 that are different in impurity concentration. Therefore, a short channel effect can be suppressed. An offset spacer OF and a side wall S3 are formed on side surfaces of a multilayer film formed by the gate insulating film GI1 and the gate electrode G1 in order. That is, the offset spacer OF covers each of the side surfaces on both sides of that multilayer film, and the side wall S3 is formed to cover a side surface of the offset spacer OF, which is located on the opposite side to the gate electrode G1. An epitaxial layer (semiconductor layer) EP, which is an elevated layer on the semiconductor layer SL, is formed next to that multilayer film in the gate-length direction. That is, a multilayer body formed by the gate insulating film GI1, the gate electrode GI, the offset spacer OF, and the side wall S3 is sandwiched by the epitaxial layers EP in the gate-length direction.

The epitaxial layer EP is an epitaxially grown layer that is formed on the semiconductor layer SL and is a semiconductor layer integrated with the semiconductor layer SL. The diffusion region D1 is formed within the epitaxial layer EP and the semiconductor layer SL. That is, the diffusion region D1 is formed from the uppermost surface of the epitaxial layer EP to the bottom surface of the semiconductor layer SL. The extension region E1 is formed only within the semiconductor layer SL, but is not formed within the epitaxial layer EP. The height of the top surface of the epitaxial layer EP is higher than the bottom surface of the gate electrode G1 and is lower than the top surface of the gate electrode G1, for example.

In the low breakdown voltage transistor region 1A, the gate electrode G1, the source region formed by one extension region E1 and one diffusion region D1, and the drain region formed by the other extension region E1 and the other diffusion region D1 constitute the low breakdown voltage transistor Q1. The extension region E1 overlaps an end in the gate-length direction of the gate electrode G1 in a plan view. That is, a portion of the extension region E1 is formed directly below the end in the gate-length direction of the gate electrode G1.

In the selecting transistor region 2A, a selecting gate electrode CG is formed on the semiconductor layer SL via a gate insulating film GI2. The gate insulating film GI2 is formed by a silicon oxide film, for example. A pair of source and drain regions is formed in the top surface of the semiconductor layer SL to sandwich the semiconductor layer SL directly below the selecting gate electrode CG. The thickness of the gate insulating film GI2 is 3 nm, for example.

In the selecting transistor region 2A, the source region has an extension region ES and a diffusion region D2, and the drain region has an extension region ED and a diffusion region DF. The extension regions ES and ED and the diffusion regions D2 and DF are n-type semiconductor regions into which n-type impurities (e.g., As (arsenic) or P (phosphorus)) are introduced. The impurity concentrations of the extension regions ES and ED are lower than those of the extension regions E1 and E3 and the diffusion regions D2 and DF. In the gate-length direction, the extension regions ES and ED are formed at positions closer to the selecting gate electrode CG than the diffusion regions D2 and DF, respectively. The top surface of the semiconductor layer SL directly below the selecting gate electrode CG in a region sandwiched by the extension regions ES and ED is a region where a channel is formed in an operation of the selecting transistor SW.

The offset spacer OF and the side wall S3 are formed on side surfaces of a multilayer film formed by the gate insulating film GI2 and the selecting gate electrode CG in order. The epitaxial layer (semiconductor layer) EP, which is an elevated layer on the semiconductor layer SL, is formed next to that multilayer film in the gate-length direction.

The epitaxial layer EP is integrated with the semiconductor layer SL. Each of the diffusion regions D2 and DF is formed within the epitaxial layer EP and the semiconductor layer SL. The extension regions ES and ED are formed only within the semiconductor layer SL, but are not formed within the epitaxial layer EP. The height of the top surface of the epitaxial layer EP is higher than the bottom surface of the selecting gate electrode CG and is lower than the top surface of the selecting gate electrode CG, for example.

In the selecting transistor region 2A, the selecting gate electrode CG, the source region formed by the extension region ES and the diffusion region D2, and the drain region formed by the extension region ED and the diffusion region DF constitute the selecting transistor SW. The extension regions ES and ED do not overlap an end in the gate-length direction of the selecting gate electrode CG in a plan view. That is, the extension regions ES and ED are not formed directly below the end in the gate-length direction of the selecting gate electrode CG at all.

One of main features of the present embodiment is that, in the gate-length direction, the selecting gate electrode CG and the extension region ES are away from each other and the selecting gate electrode CG and the extension region ED are away from each other. The extension regions ES and ED are formed directly below the offset spacer OF and directly below the side wall S3. The reason why the extension regions ES and ED are not formed directly below the selecting gate electrode CG, whereas a portion of the extension region E1 of the low breakdown voltage transistor Q1 extends to directly below the gate electrode G1, as described above is that the impurity concentrations of the extension regions ES and ED are lower than that of the extension region E1. That is, because of low impurity concentrations of the extension regions ES and ED, the n-type impurities forming the inside of the extension regions ES and ED are not diffused in a wide range.

In the memory transistor region 3A, a memory gate electrode MG is formed on the semiconductor layer SL via an ONO (Oxide Nitride Oxide) film ON. The ONO film ON is a multilayer film including a silicon oxide film OX1, a silicon nitride film N1, and a silicon oxide film OX2 that are formed on the semiconductor layer SL in order. The silicon nitride film N1 serves as a charge storage portion for storing electrons (charges) in the memory transistor MT as information. A pair of source and drain regions is formed in the top surface of the semiconductor layer SL to sandwich the semiconductor layer SL directly below the memory gate electrode MG.

In the memory transistor region 3A, the source region has the extension region E3 and the diffusion region DF, and the drain region has the extension region E3 and a diffusion region D3. The extension region E3 and the diffusion region D3 are n-type semiconductor regions into which n-type impurities (e.g., As (arsenic) or P (phosphorus)) are introduced. The impurity concentration of the extension region E3 is lower than those of the diffusion regions D3 and DF. In the gate-length direction, the extension region E3 is formed at a position closer to the memory gate electrode MG than the diffusion regions D3 and DF. The top surface of the semiconductor layer SL directly below the memory gate electrode MG in a region sandwiched by the extension regions E3 is a region where a channel is formed in an operation of the memory transistor MT.

The offset spacer OF and the side wall S3 are formed on side surfaces of a multilayer film formed by the ONO film ON and the memory gate electrode MG in order. The epitaxial layer (semiconductor layer) EP, which is an elevated layer on the semiconductor layer SL, is formed next to that multilayer film in the gate-length direction.

The epitaxial layer EP is integrated with the semiconductor layer SL. The diffusion region D3 is formed within the epitaxial layer EP and the semiconductor layer SL. The extension region E3 is formed only within the semiconductor layer SL, but is not formed within the epitaxial layer EP. The height of the top surface of the epitaxial layer EP is higher than the bottom surface of the memory gate electrode MG and is lower than the top surface of the memory gate electrode MG, for example.

In the memory transistor region 3A, the memory gate electrode MG, the source region formed by one extension region E3 and the diffusion region DF, and the drain region formed by the other extension region E3 and the diffusion region D3 constitute the memory transistor MT. The extension region E3 overlaps an end in the gate-length direction of the memory gate electrode MG in a plan view. That is, a portion of the extension region E3 is formed directly below the end in the gate-length direction of the memory gate electrode MG.

The selecting transistor SW and the memory transistor MT share the diffusion region DF with each other. That is, the drain region of the selecting transistor SW and the source region of the memory transistor MT are coupled to each other.

In the high breakdown voltage transistor region 4A, a gate electrode G4 is formed on the semiconductor substrate SB via a gate insulating film GI4. The gate insulating film GI4 is formed by a silicon oxide film, for example. A pair of source and drain regions is formed on the main surface of the semiconductor substrate SB to sandwich the semiconductor substrate SB directly below the gate electrode G4. In other words, the gate electrode G4 is formed directly above the semiconductor substrate SB between the source region and the drain region formed in the semiconductor substrate SB. The thickness of the gate insulating film GI4 is 8 nm, for example. That is, the thickness of the gate insulating film GI4 is larger than that of each of the gate insulating films GI1 and GI2. Further, the length in the gate-length direction of the gate electrode GI4 is larger than the length in the gate-length direction of each of the gate electrode G1, the selecting gate electrode CG, and the memory gate electrode MG.

In the high breakdown voltage transistor region 4A, each of the source region and the drain region has an extension region E4 and a diffusion region D4 each referred to as an LDD (Lightly Doped Drain) regions. The extension region E4 and the diffusion region D4 are n-type semiconductor regions into which n-type impurities (e.g., As (arsenic) or P (phosphorus)) are introduced. The impurity concentration of the extension region E4 is lower than those of the diffusion region D4. In the gate-length direction, the extension region E4 is formed at a position closer to the gate electrode G4 than the diffusion region D4. The top surface of the semiconductor substrate SB directly below the gate electrode G4 in a region sandwiched by the extension region E4 forming the source region and the extension region E4 forming the drain region is a region where a channel is formed in an operation of the transistor Q4.

The offset spacer OF and a side wall S2 are formed on side surfaces of a multilayer film formed by the gate insulating film GI4 and the gate electrode G4 in order. The epitaxial layer (semiconductor layer) EP is not formed next to that multilayer film in the gate-length direction. The formation depth of the diffusion region D4 is deeper than that of the extension region E4.

In the high breakdown voltage transistor region 4A, the gate electrode G4, the source region formed by one extension region E4 and one diffusion region D4, and the drain region formed by the other extension region E4 and the other diffusion region D4 constitute the high breakdown voltage transistor Q4. The extension region E4 overlaps an end in the gate-length direction of the gate electrode G4 in a plan view. That is, a portion of the extension region E4 is formed directly below the end in the gate-length direction of the gate electrode G4.

Each of the gate electrodes G1 and G4, the selecting gate electrode CG, and the memory gate electrode MG is a conductor film, for example, formed by a silicon film. The offset spacer OF is formed by a silicon oxide film, for example. The side walls S2 and S3 are each formed by a silicon nitride film, for example. All the extension regions E1, E3, ES, and ED are formed from the top surface of the semiconductor layer SL to the bottom surface of the semiconductor layer SL. However, the extension regions E1, E3, ES, and ED may be formed in the top surface of the semiconductor layer SL but not reach the bottom surface of the semiconductor layer SL.

An interlayer insulating film IL, formed by a silicon oxide film, for example, is formed on the main surface of the semiconductor substrate SB to cover the low breakdown voltage transistor Q1, the selecting transistor SW, the memory transistor MT, and the high breakdown voltage transistor Q4. A plug PG is formed in each of a plurality of contact holes extending through the interlayer insulating film IL. The plug PG is a coupling portion that couples each semiconductor element and wiring (not illustrated) to each other. The plug PG is mainly formed of tungsten (W), for example. FIG. 2 illustrates the plug PG coupled to the top surface of each of the diffusion regions D1 to D4 and DF only. However, plugs PG electrically coupled to the gate electrodes G1 and G4, the selecting gate electrode CG, and the memory gate electrode MG, respectively, are also formed in a region that is not illustrated.

Although illustration is omitted in FIG. 2, a silicide layer, which is formed of nickel silicide (NiSi), cobalt silicide (CoSi), or the like, is formed on the top surface of each of the diffusion regions D1 to D4 and DF, the gate electrodes G1 and G4, the selecting gate electrode CG, and the memory gate electrode MG. That is, the diffusion regions D1 to D4 and DF, the gate electrodes G1 and G4, the selecting gate electrode CG, and the memory gate electrode MG are electrically coupled to the plugs PG via the silicide layers. The top surface of each of the plugs PG and the top surface of the interlayer insulating film IL are flattened in approximately the same plane. In addition, a plurality of wiring layers including an interlayer insulating film and wiring embedded in that interlayer insulating film are stacked on the interlayer insulating film IL, although not illustrated.

The source region of the selecting transistor SW illustrated in FIG. 2 is coupled to the selecting line SL1 or SL2 illustrated in FIG. 1. The drain region of the memory transistor MT illustrated in FIG. 2 is coupled to the bit line BL1 or BL2 illustrated in FIG. 1. The memory gate electrode MG illustrated in FIG. 2 is coupled to the word line WL1 or WL1u illustrated in FIG. 1. The selecting gate electrode CG illustrated in FIG. 2 is coupled to the word line WL2 or WL2u illustrated in FIG. 1. The memory transistor MT that is a non-volatile memory element is a single-gate MONOS (Metal Oxide Nitride Oxide Semiconductor) memory.

<Manufacturing Method of Semiconductor Device>

A manufacturing method of the semiconductor device of the present embodiment is described below, with reference to FIGS. 3 to 16. FIGS. 3 to 16 are cross-sectional views explaining manufacturing steps of the semiconductor device according to the present embodiment. In FIGS. 3 to 16, the low breakdown voltage transistor region 1A, the selecting transistor region 2A, the memory transistor region 3A, and the high breakdown voltage transistor region 4A are illustrated in that order from left.

A case of forming an n-type MOSFET (Metal Oxide Semiconductor Field Effect Transistor) in each of the above regions is described here. However, a p-type MOSFET may be formed in those regions. In the latter case, conductive types of wells, source and drain regions. And the like that will be described later are set to different conductive types. Further, a p-type MOSFET is also formed in another region (not illustrated) in the low breakdown voltage transistor region 1A that is a peripheral circuit region. That is, a CMOS is formed in the low breakdown voltage transistor region 1A.

Figure 3:
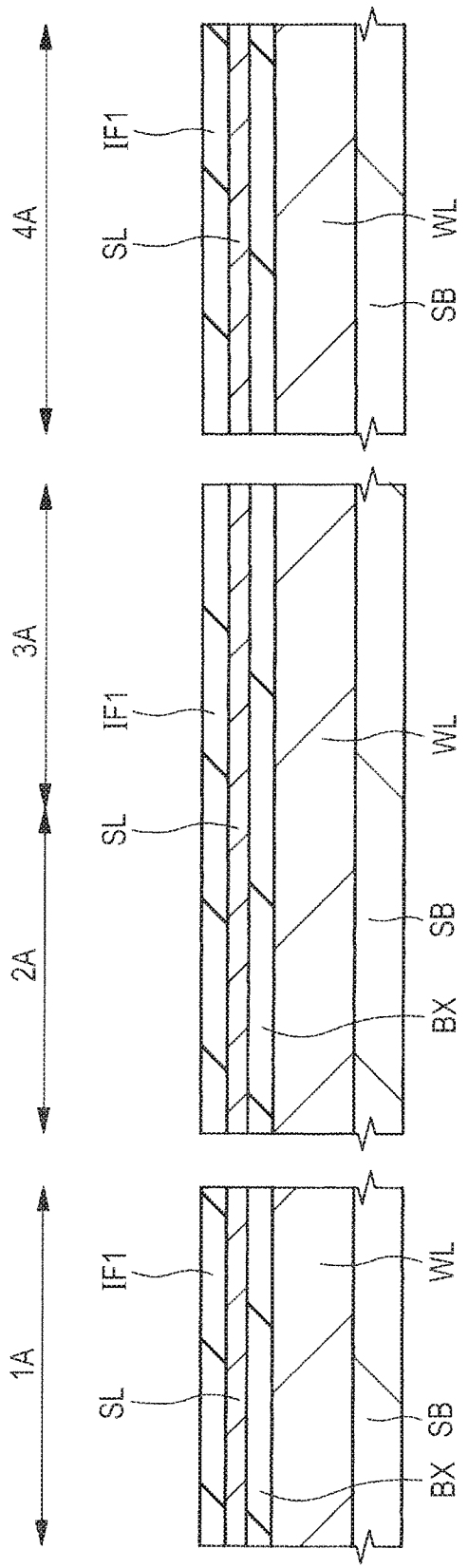
FIG. 3 is a cross-sectional view explaining a manufacturing step of the semiconductor device according to the first embodiment of the present invention.

First, the semiconductor substrate SB with the BOX film BX that is a buried oxide film and the semiconductor layer SL formed in order on a main surface thereof is prepared, as illustrated in FIG. 3. A multilayer substrate including the semiconductor substrate SB, the BOX film BX, and the semiconductor layer SL forms an SOI substrate. The semiconductor substrate SB is formed of single-crystal silicon (Si), for example. The thickness of the BOX film BX is 30 nm or less, for example. The thickness of the semiconductor layer SL is 20 nm or less, for example. Subsequently, an insulating film IF1 is formed on the semiconductor layer SL. The insulating film IF1 is formed by a silicon oxide film formed by thermal oxidation, for example.

Subsequently, element isolation regions are formed in regions (not illustrated) to isolate the low breakdown voltage transistor region 1A, the selecting transistor region 2A, the memory transistor region 3A, and the high breakdown voltage transistor region 4A from one another. Note that no element isolation region is formed between the selecting transistor region 2A and the memory transistor region 3A. The element isolation region is formed by an insulating film (e.g., a silicon oxide film) embedded in a groove that extends through the insulating film IF1, the semiconductor layer SL, and the BOX film BX and reaches a middle depth of the semiconductor substrate SB.

Subsequently, p-type impurities (e.g., B (boron)) are implanted into the main surface of the semiconductor substrate SB by ion implantation, thereby forming a well WL that is a p-type semiconductor region in the main surface of the semiconductor substrate SB. Ion implantation may be separately performed for each of the low breakdown voltage transistor region 1A, the selecting transistor region 2A, the memory transistor region 3A, and the high breakdown voltage transistor region 4A to form wells WL having different impurity concentrations from one another. Further, another p-type well of which the formation depth is shallower than the well WL may be further formed in the main surface of the semiconductor substrate SB in the high breakdown voltage transistor region 4A, although not illustrated.

Figure 4:
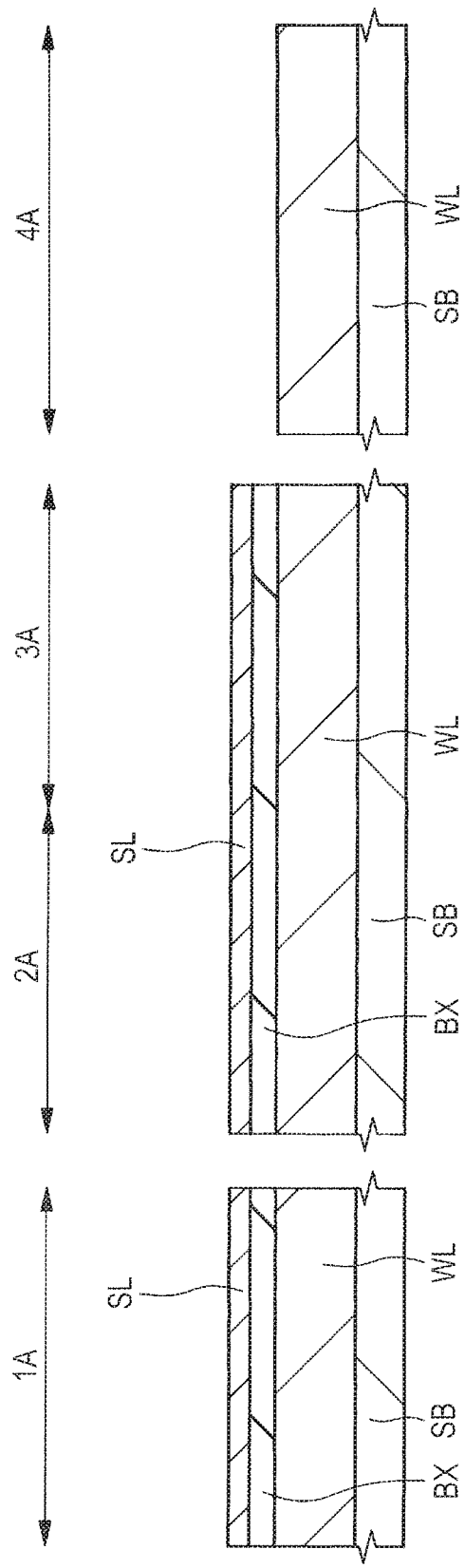
FIG. 4 is a cross-sectional view in a manufacturing step of the semiconductor device following FIG. 3.

Then, after the insulating film IF1 on the semiconductor substrate SB is removed, the semiconductor layer SL and the BOX film BX on the main surface of the semiconductor substrate SB in the high breakdown voltage transistor region 4A are removed, so that the main surface of the semiconductor substrate SB is exposed from the semiconductor layer SL and the BOX film BX, as illustrated in FIG. 4.

Figure 5:
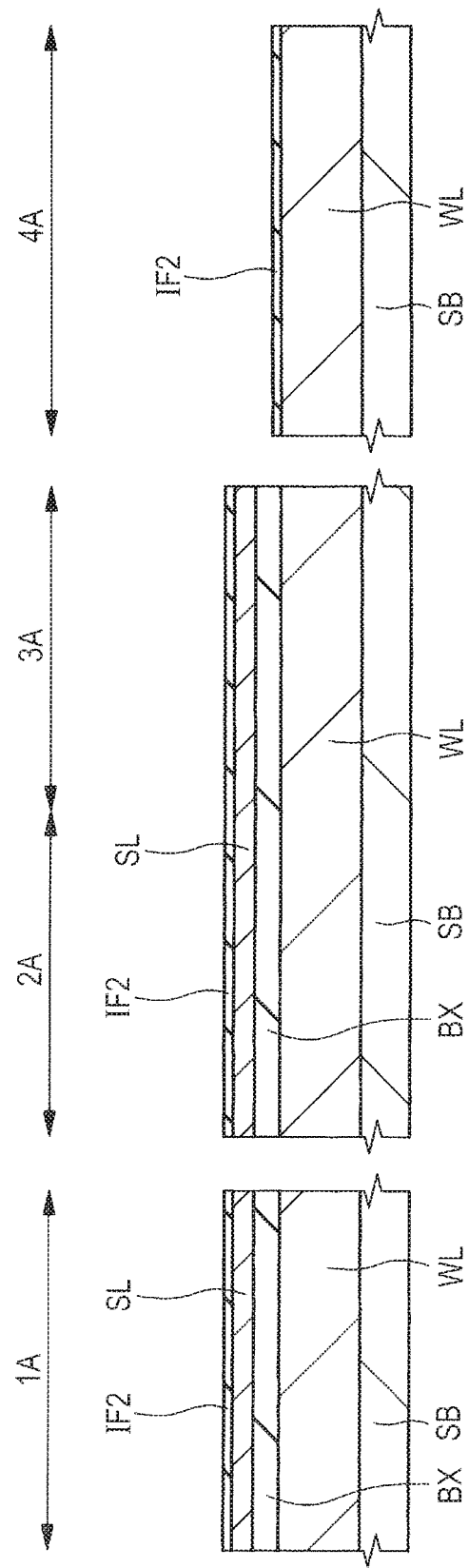
FIG. 5 is a cross-sectional view in a manufacturing step of the semiconductor device following FIG. 4.

Subsequently, an insulating film IF2 is formed by thermal oxidation, for example, to cover the top surface of the semiconductor layer SL in the low breakdown voltage transistor region 1A, the selecting transistor region 2A, and the memory transistor region 3A, and the main surface of the semiconductor substrate SB in the high breakdown voltage transistor region 4A, as illustrated in FIG. 5. The insulating film IF2 is formed by a silicon oxide film, for example.

Figure 6:
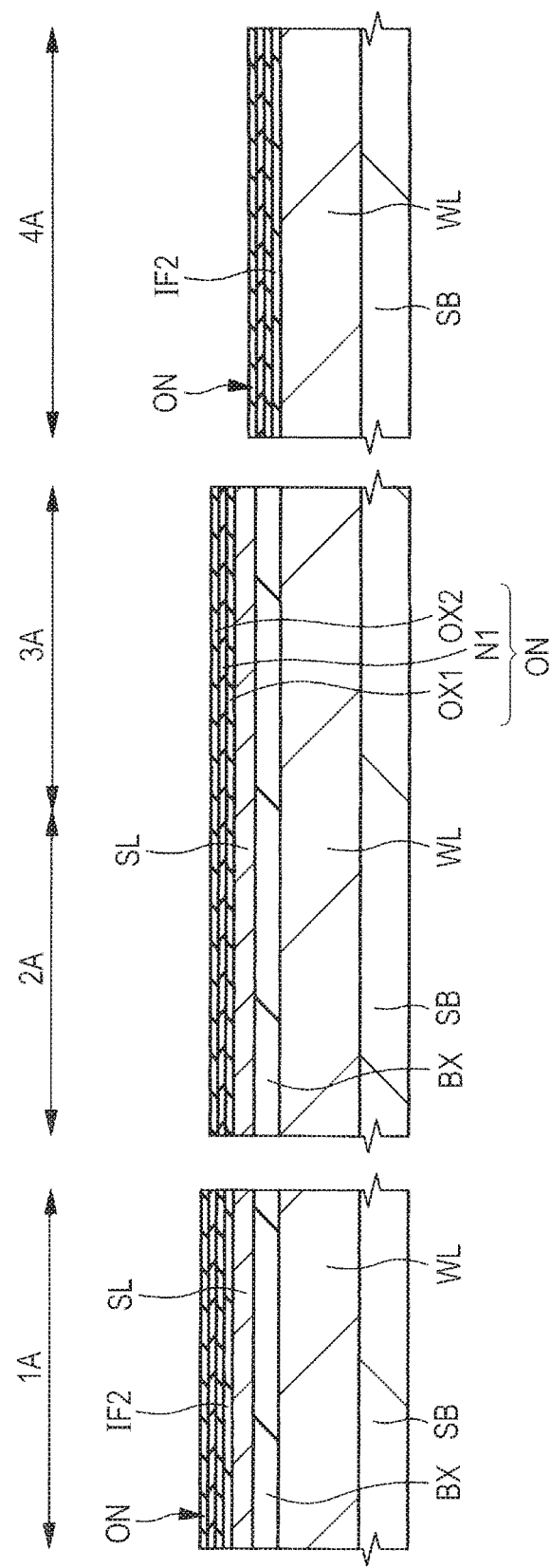
FIG. 6 is a cross-sectional view in a manufacturing step of the semiconductor device following FIG. 5.

Then, after the insulating film IF2 in the selecting transistor region 2A is removed, the ONO film ON is formed on the semiconductor substrate SB, as illustrated in FIG. 6. That is, after the silicon oxide film OX1 is formed by thermal oxidation, for example, the silicon nitride film N1 and the silicon oxide film OX2 are formed in order by CVD (Chemical Vapor Deposition), for example. In this manner, the ONO film ON formed by the silicon oxide film OX1, the silicon nitride film N1, and the silicon oxide film OX2 is formed. Thus, the ONO film ON is formed on the semiconductor layer SL in the low breakdown voltage transistor region 1A and the insulating film IF2 in the selecting transistor region 2A, the memory transistor region 3A, and the high breakdown voltage transistor region 4A.

Figure 7:
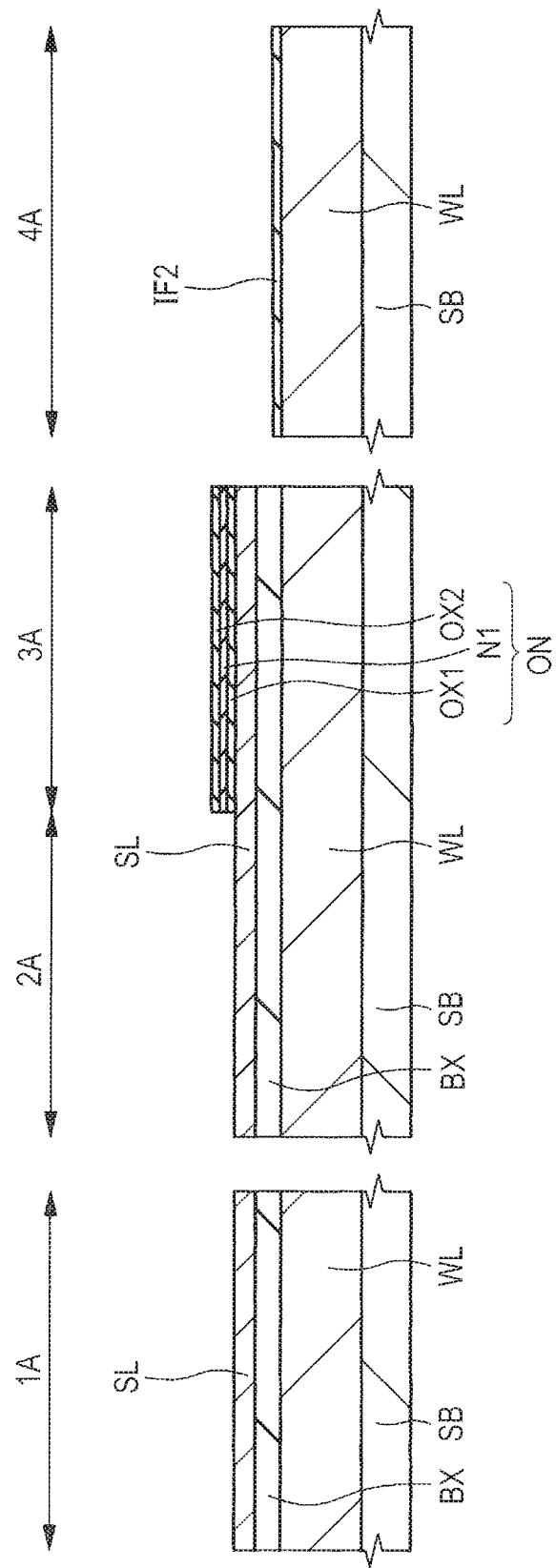
FIG. 7 is a cross-sectional view in a manufacturing step of the semiconductor device following FIG. 6.

Then, while the ONO film ON in the memory transistor region 3A is left, the ONO film ON in the other regions is removed. Thereafter, the insulating film IF2 in the low breakdown voltage transistor region 1A is removed, as illustrated in FIG. 7.

Figure 8:
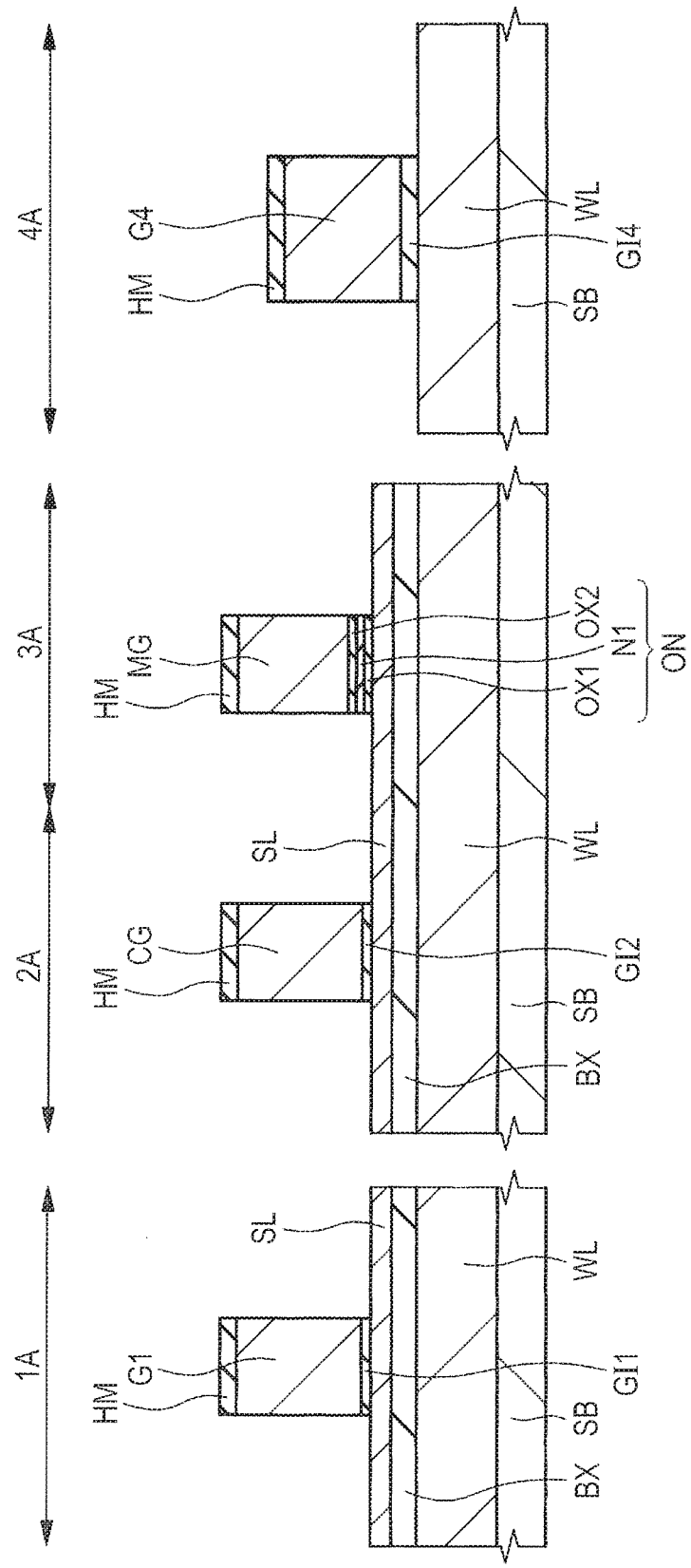
FIG. 8 is a cross-sectional view in a manufacturing step of the semiconductor device following FIG. 7.

Subsequently, an insulating film is formed by thermal oxidation, for example, to cover the top surface of the ONO film ON in the memory transistor region 3A, the top surface of the semiconductor layer SL in the low breakdown voltage transistor region 1A and the selecting transistor region 2A, and the top surface of the insulating film IF2 in the high breakdown voltage transistor region 4A, as illustrated in FIG. 8. Subsequently, a silicon film and a silicon nitride film are formed on the entire main surface of the semiconductor substrate SB in order by CVD, for example. The silicon nitride film is then processed, thereby forming hard mask HM formed by the silicon nitride film. Thereafter, etching is performed by using the hard mask HM as an etching protection film to remove a portion of each the above silicon film, the ONO film ON, the above insulating film, and the insulating film IF2.

Thus, in the low breakdown voltage transistor region 1A, a multilayer pattern is formed on the semiconductor layer SL, which is formed by the gate insulating film GI1 formed by the above insulating film, the gate electrode G1 formed by the above silicon film, and the hard mask HM. The top surface of the semiconductor layer SL is exposed next to that multilayer pattern. Further, in the selecting transistor region 2A, a multilayer pattern is formed on the semiconductor layer SL, which is formed by the gate insulating film GI2 formed by the above insulating film, the selecting gate electrode CG formed by the above silicon film, and the hard mask HM. The top surface of the semiconductor layer SL is exposed next to that multilayer pattern. Furthermore, in the memory transistor region 3A, a multilayer pattern is formed on the semiconductor layer SL, which is formed by the ONO film ON, the memory gate electrode MG formed by the above silicon film, and the hard mask HM. The top surface of the semiconductor layer SL is exposed next to that multilayer pattern. In addition, in the high breakdown voltage transistor region 4A, a multilayer pattern is formed on the semiconductor substrate SB, which is formed by the gate insulating film GI4 formed by the above insulating film and the insulating film IF2, the gate electrode G4 formed by the above silicon film, and the hard mask HM. The main surface of the semiconductor substrate SB is exposed next to that multilayer pattern.

Figure 9:
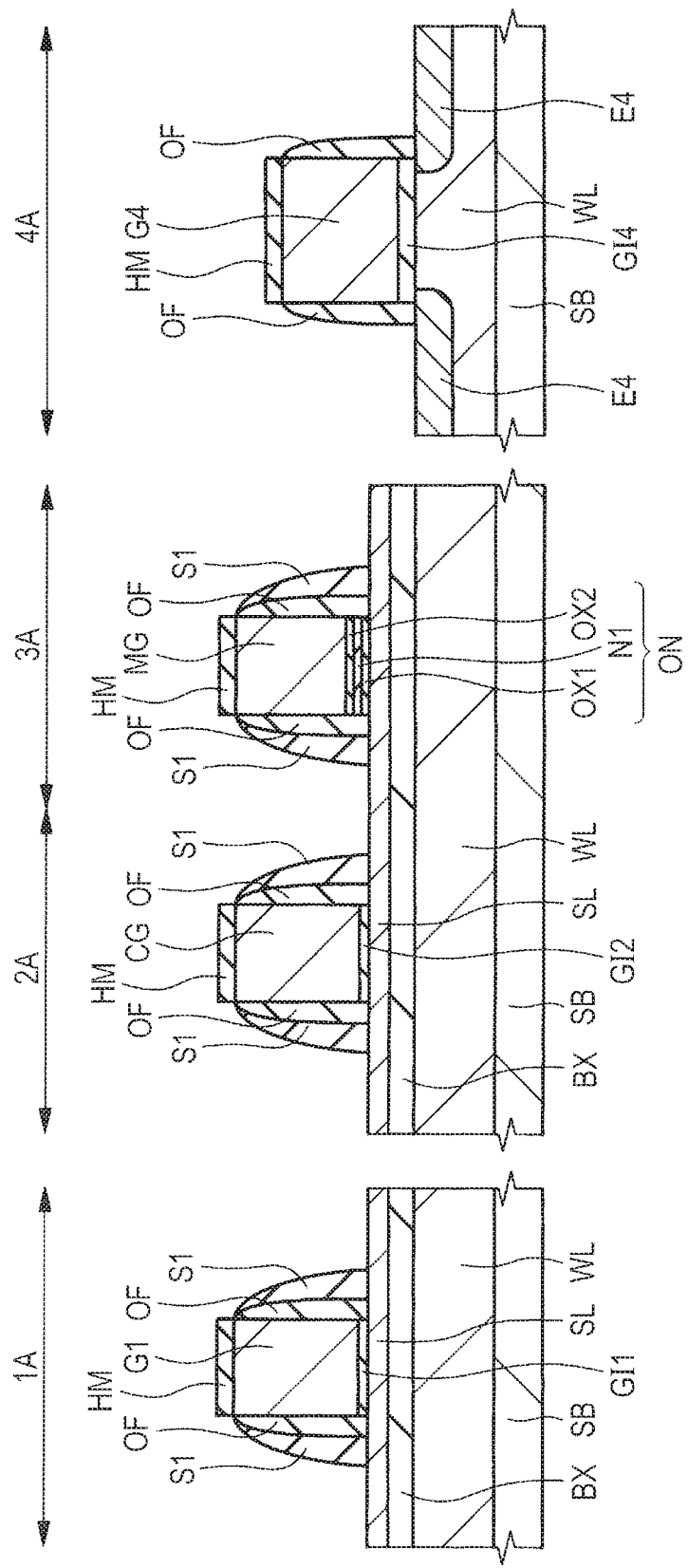
FIG. 9 is a cross-sectional view in a manufacturing step of the semiconductor device following FIG. 8.

Subsequently, the offset spacer OF is formed to cover side surfaces of each of the gate electrode G1, the selecting gate electrode CG, the memory gate electrode MG, and the gate electrode G4, as illustrated in FIG. 9. In formation of the offset spacer OF, a silicon oxide film is deposited by CVD or the like on the semiconductor substrate SB, and thereafter a portion of that silicon oxide film is removed by anisotropic etching. The offset spacer OF is formed by that silicon oxide film left on the side surface of each gate electrode.

Subsequently, n-type impurities (e.g., As (arsenic) or P (phosphorous)) are implanted into the main surface of the semiconductor substrate SB in the high breakdown voltage transistor region 4A by using a photoresist film covering the low breakdown voltage transistor region 1A, the selecting transistor region 2A, and the memory transistor region 3A as mask. In this manner, a pair of extension regions E4 is formed. The extension region E4 is an n-type semiconductor region of which the formation depth is shallower than the well WL. Thereafter, the above photoresist film is removed.

Subsequently, after a photoresist film covering the high breakdown voltage transistor region 4A is formed, the side wall S1 is formed which covers the side surfaces of each of the gate electrode G1, the selecting gate electrode CG, and the memory gate electrode MG via the offset spacer OF. In formation of the side wall S1, a silicon nitride film is deposited by CVD or the like on the semiconductor substrate SB, and thereafter a portion of that silicon nitride film is removed by anisotropic etching. The side wall S1 is formed by that silicon nitride film left on the side surface of each gate electrode. Thereafter, the above photoresist film is removed.

Figure 10:
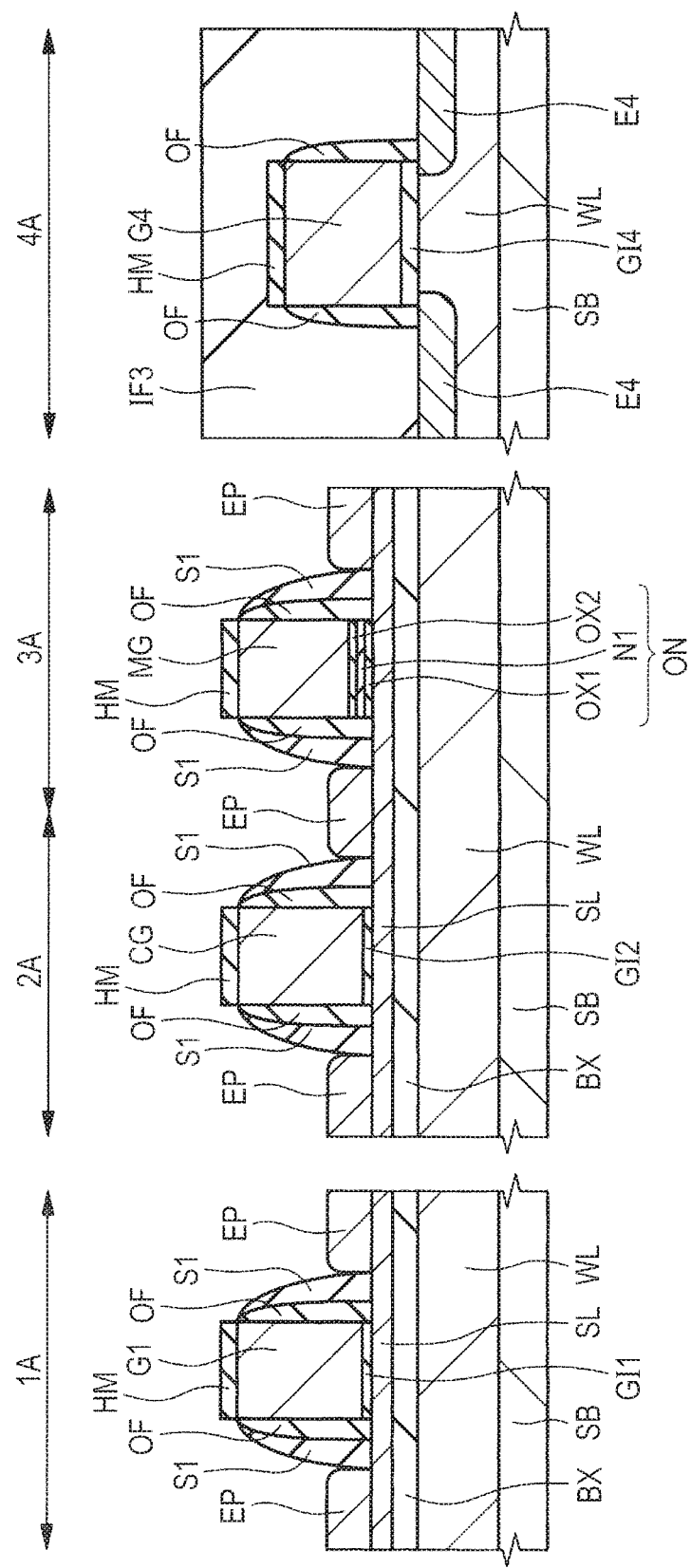
FIG. 10 is a cross-sectional view in a manufacturing step of the semiconductor device following FIG. 9.

Subsequently, an insulating film IF3 is formed which covers the high breakdown voltage transistor region 4A and allows the low breakdown voltage transistor region 1A, the selecting transistor region 2A, and the memory transistor region 3A to be exposed. Thereafter, the epitaxial layer (semiconductor layer) EP is formed on the semiconductor layer SL by epitaxial growth, as illustrated in FIG. 10. The insulating film IF3 is formed by a silicon nitride film, for example. That is, a pair of epitaxial layers EP is formed on the semiconductor layer SL next to each of the gate electrode G1, the selecting gate electrode CG, and the memory gate electrode MG. Further, it can be considered that a silicon oxide film is formed on the top surface of the epitaxial layer EP. However, illustration of that silicon oxide film is omitted. Furthermore, no epitaxial layer is formed on the semiconductor substrate SB in the high breakdown voltage transistor region 4A, because the high breakdown voltage transistor region 4A is covered by the insulating film IF3.

The selecting transistor region 2A and the memory transistor region 3A are adjacent to each other in the gate-length direction of each of the selecting gate electrode CG and the memory gate electrode MG. Therefore, the epitaxial layer EP adjacent to one side surface of the selecting gate electrode CG via the offset spacer OF and the side wall S1 and the epitaxial layer EP adjacent to one side surface of the memory gate electrode MG via the offset spacer OF and the side wall S1 are the same one.

Figure 11:
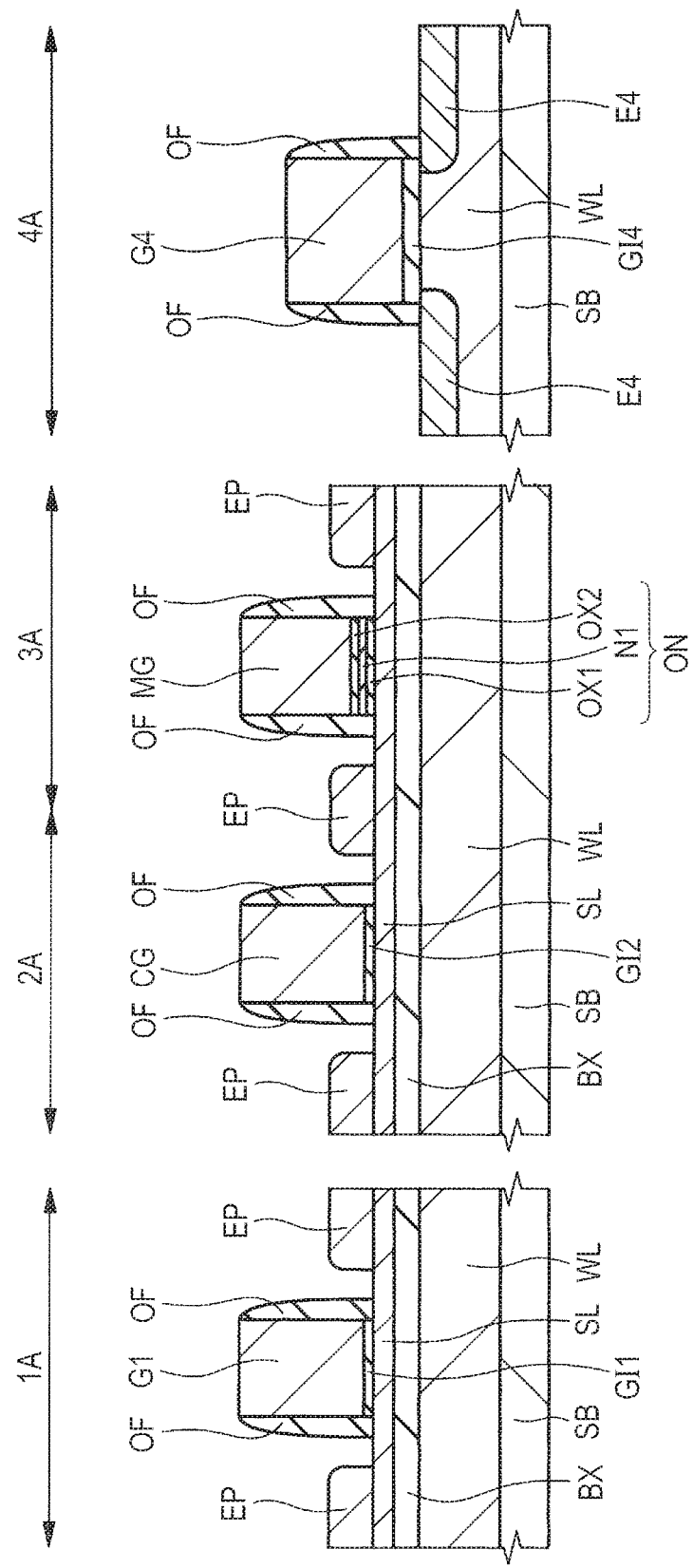
FIG. 11 is a cross-sectional view in a manufacturing step of the semiconductor device following FIG. 10.

Subsequently, the insulating film IF3 and the side wall S1 are removed by wet etching, for example, as illustrated in FIG. 11.

Figure 12:
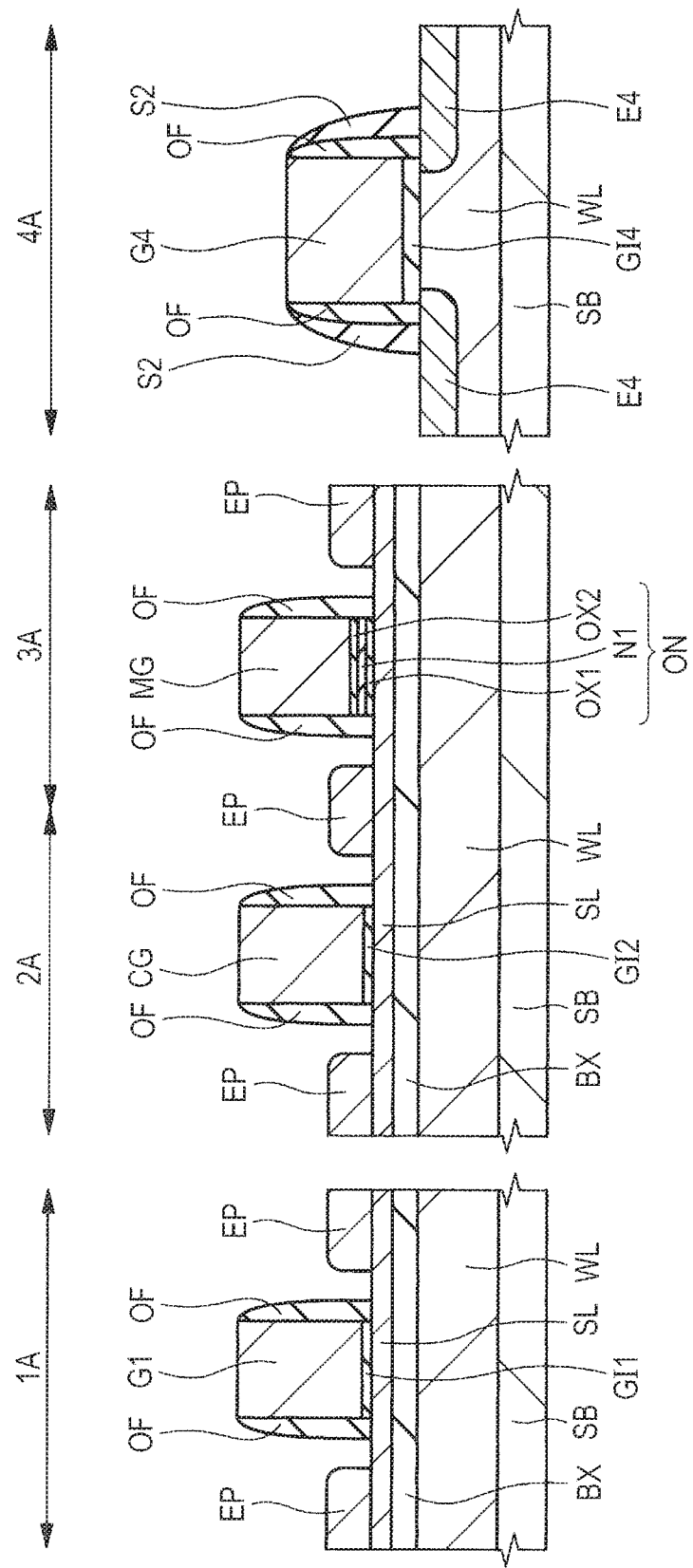
FIG. 12 is a cross-sectional view in a manufacturing step of the semiconductor device following FIG. 11.

Then, a photoresist film (not illustrated) is formed to cover the low breakdown voltage transistor region 1A, the selecting transistor region 2A, and the memory transistor region 3A, and thereafter the side wall S2 is formed in the high breakdown voltage transistor region 4A to cover the side surfaces of the gate electrode G4 via the offset spacer OF, as illustrated in FIG. 12. In formation of the side wall S2, a silicon nitride film is deposited by CVD or the like on the semiconductor substrate SB, and thereafter a portion of that silicon nitride film is removed by anisotropic etching. The side wall S2 is formed by that silicon nitride film left on the side surface of the gate electrode G4. Thereafter, the above photoresist film is removed.

Figure 13:
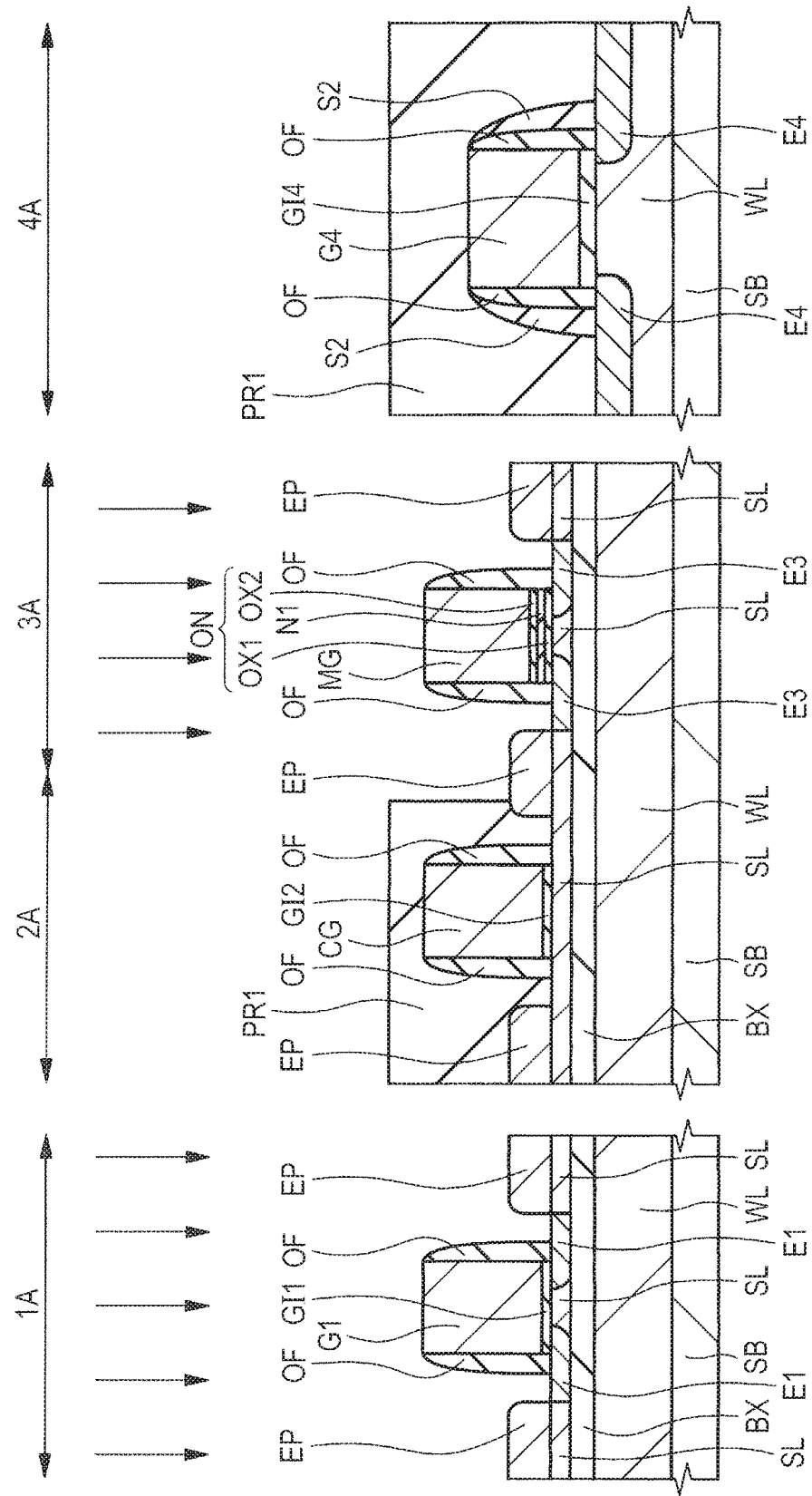
FIG. 13 is a cross-sectional view in a manufacturing step of the semiconductor device following FIG. 12.

Subsequently, a photoresist film PR1 is formed, which covers the selecting transistor region 2A and the high breakdown voltage transistor region 4A, as illustrated in FIG. 13. Then, n-type impurities (e.g., As (arsenic) or P (phosphorous)) are implanted into the top surface of the semiconductor layer SL in the low breakdown voltage transistor region 1A and the memory transistor region 3A by using the photoresist film PR1 as mask. In this manner, a pair of extension regions E1 is formed in the semiconductor layer SL in the low breakdown voltage transistor region 1A, and a pair of extension regions E3 is formed in the semiconductor layer SL in the memory transistor region 3A. Although n-type impurities are also implanted into the epitaxial layer EP to form portions of the extension regions E1 and E3, illustration of semiconductor regions formed in the epitaxial layer EP is omitted.

Since the impurity concentrations of the extension regions E1 and E3 are higher than those of the extension regions ES and ED that will be described later with reference to FIG. 14, the extension regions E1 and E3 are formed in a wider range in the semiconductor layer SL. Therefore, an end of the extension region E1 reaches directly below an end in the gate-length direction of the gate electrode G1, and an end of the extension region E3 reaches directly below an end in the gate-length direction of the memory gate electrode MG.

Figure 14:
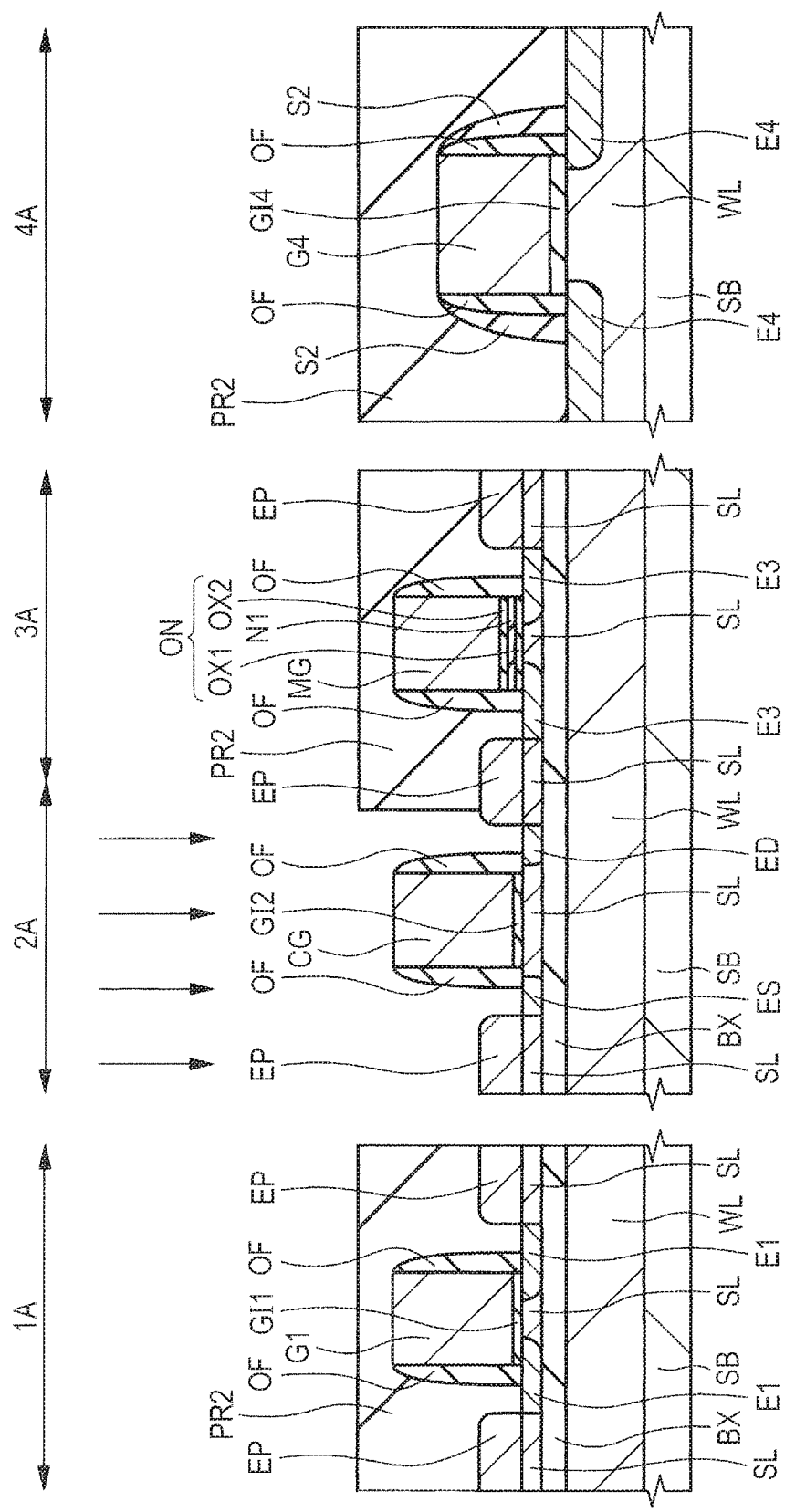
FIG. 14 is a cross-sectional view in a manufacturing step of the semiconductor device following FIG. 13.

Subsequently, the photoresist film PR1 is removed, and thereafter a photoresist film PR2 is formed which covers the low breakdown voltage transistor region 1A, the memory transistor region 3A, and the high breakdown voltage transistor region 4A, as illustrated in FIG. 14. Then, n-type impurities (e.g., As (arsenic) or P (phosphorous)) are implanted into the top surface of the semiconductor layer SL in the selecting transistor region 2A by using the photoresist film PR2 as mask. In this manner, a pair of extension regions ES and ED is formed in the semiconductor layer SL in the selecting transistor region 2A. Note that illustration of a semiconductor region formed by introduction of n-type impurities into the epitaxial layer EP is omitted. The extension regions ES and ED are formed to sandwich the semiconductor layer SL directly below the selecting gate electrode CG. The extension region ED is formed in the semiconductor layer SL on the memory gate electrode MG side.

Since the impurity concentrations of the extension regions ES and ED are lower than those of the extension regions E1 and E3, the extension regions ES and ED are not widely diffused in the semiconductor layer SL and is formed in a narrow range. Therefore, each of the extension regions ES and ED does not reach directly below the selecting gate electrode CG. In other words, an end on the selecting gate electrode CG side of each of the extension regions ES and ED is terminated at a position away from the selecting gate electrode CG in the gate-length direction of the selecting gate electrode CG.

Figure 15:
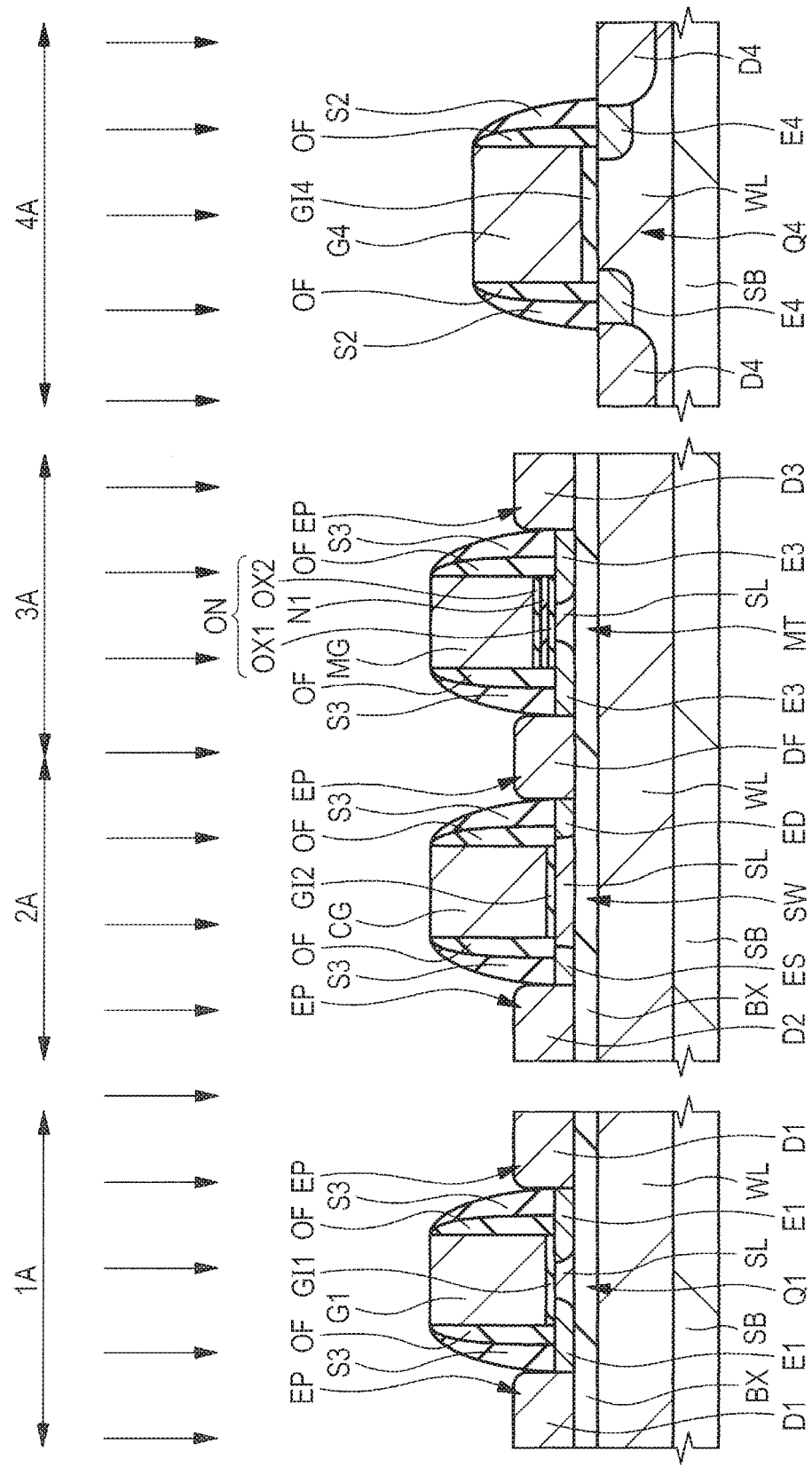
FIG. 15 is a cross-sectional view in a manufacturing step of the semiconductor device following FIG. 14.

Subsequently, the photoresist film PR2 is removed, as illustrated in FIG. 15. Thereafter, a photoresist film covering the high breakdown voltage transistor region 4A is formed, and then the side wall S3 is formed which covers the side surfaces of each of the gate electrode G1, the selecting gate electrode CG, and the memory gate electrode MG via the offset spacer OF. In formation of the side wall S3, a silicon nitride film is deposited by CVD or the like on the semiconductor substrate SB, and thereafter a portion of that silicon nitride film is removed by anisotropic etching. The side wall S3 is formed by that silicon nitride film left on the side surfaces of each gate electrode. Thereafter, the above photoresist film is removed. The side wall S3 in each of the low breakdown voltage transistor region 1A, the selecting transistor region 2A, and the memory transistor region 3A is formed between the offset spacer OF and the epitaxial layer EP.

Subsequently, n-type impurities (e.g., As (arsenic) or P (phosphorous)) are implanted into the epitaxial layer EP and the semiconductor layer SL in the low breakdown voltage transistor region 1A, the selecting transistor region 2A, and the memory transistor region 3A and into the main surface of the semiconductor substrate SB in the high breakdown voltage transistor region 4A. In this ion implantation, a photoresist film is used as mask, thereby performing ion implantation for the low breakdown voltage transistor region 1A, the selecting transistor region 2A, and the memory transistor region 3A and ion implantation for the high breakdown voltage transistor region 4A separately from each other.

In this manner, a pair of diffusion regions D1 is formed in the epitaxial layer EP in the low breakdown voltage transistor region 1A and the semiconductor layer SL directly below that epitaxial layer EP. Further, the diffusion region D2 is formed in the epitaxial layer EP in the selecting transistor region 2A and the semiconductor layer SL directly below that epitaxial layer EP. Furthermore, the diffusion region D3 is formed in the epitaxial layer EP in the memory transistor region 3A and the semiconductor layer SL directly below that epitaxial layer EP. A pair of diffusion regions D4 is formed in the main surface of the semiconductor substrate SB in the high breakdown voltage transistor region 4A. In this step, the diffusion region DF is formed in the epitaxial layer EP at the boundary between the selecting transistor region 2A and the memory transistor region 3A and in the semiconductor layer SL directly below that epitaxial layer EP.

The diffusion regions D1 to D3 and DF are formed from the top surface of the epitaxial layer EP to the bottom surface of the semiconductor layer SL. The diffusion region D4 is formed to have a deeper formation depth than the extension region E4. The diffusion regions D1 to D3 and DF are n-type semiconductor regions of which the impurity concentrations are higher than that of any of the extension regions E1, E3, E4, ES, and ED. In the low breakdown voltage transistor region 1A, the extension region E1 and the diffusion region D1 adjacent to each other on one side surface side of the gate electrode G1 form the source region, and the extension region E1 and the diffusion region D1 adjacent to each other on the other side surface side of the gate electrode G1 form the drain region. In the selecting transistor region 2A, the extension region ES and the diffusion region D2 adjacent to each other on one side surface side of the selecting gate electrode CG constitute the source region, and the extension region ED and the diffusion region DF adjacent to each other on the other side surface side of the selecting gate electrode CG constitute the drain region.

In the memory transistor region 3A, the extension region E3 and the diffusion region DF adjacent to each other on one side surface side of the memory gate electrode MG constitute the source region, and the extension region E3 and the diffusion region D3 adjacent to each other on the other side surface side of the memory gate electrode MG constitute the drain region. In the high breakdown voltage transistor region 4A, the extension region E4 and the diffusion region D4 adjacent to each other on one side surface side of the gate electrode G4 constitute the source region, and the extension region E4 and the diffusion region D4 adjacent to each other on the other side surface side of the gate electrode G4 constitute the drain region.

The source and drain regions and the gate electrode G1 in the low breakdown voltage transistor region 1A form the low breakdown voltage transistor Q1. The source and drain regions and the selecting gate electrode CG in the selecting transistor region 2A form the selecting transistor (switching transistor) SW. The source and drain regions and the memory gate electrode MG in the memory transistor region 3A form the memory transistor MT. The source and drain regions and the gate electrode G4 in the high breakdown voltage transistor region 4A form the high breakdown voltage transistor Q4. The selecting transistor SW and the memory transistor MT share the diffusion region DF with each other.

Subsequently, a salicide process is performed, thereby forming a silicide layer on the top surface of the gate electrode G1, the top surface of the selecting gate electrode CG, the top surface of the memory gate electrode MG, the top surface of the gate electrode G4, and surfaces of the respective diffusion regions D1 to D4 and DF, although not illustrated. In this salicide process, a metal film containing Co (cobalt) or Ni (nickel), for example, is formed on the entire main surface of the semiconductor substrate SB by sputtering, and thereafter the semiconductor substrate SB is heated to cause reaction of the metal film and semiconductor, thereby forming the silicide layer. Then, the metal film that has not reacted is removed.

Figure 16:
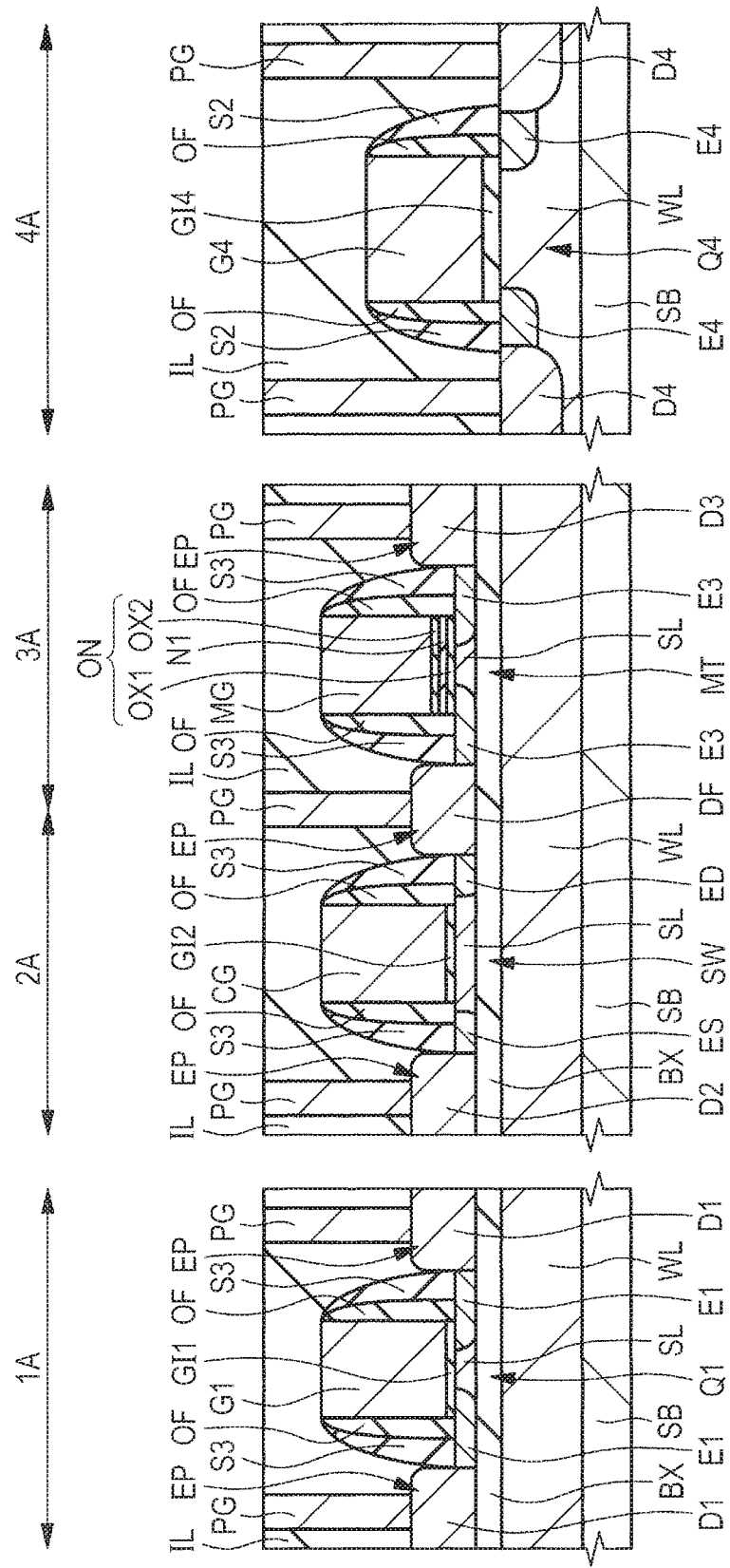
FIG. 16 is a cross-sectional view in a manufacturing step of the semiconductor device following FIG. 15.

Subsequently, the interlayer insulating film IL is formed on the semiconductor substrate SB to cover the low breakdown voltage transistor Q1, the selecting transistor SW, the memory transistor MT, and the high breakdown voltage transistor Q4, as illustrated in FIG. 16. The interlayer insulating film IL is formed by forming a silicon oxide film on the entire main surface of the semiconductor substrate SB by CVD, for example, and then polishing the top surface of that silicon oxide film by CMP (Chemical Mechanical Polishing) or the like. The thickness of the interlayer insulating film IL is larger than the thickness of each of the gate electrode G1, the selecting gate electrode CG, the memory gate transistor MG, and the gate electrode G4.

Subsequently, a plurality of contact holes extending through the interlayer insulating film IL are formed by photolithography and dry etching, and thereafter a plurality of plugs PG embedded in the respective contact holes are formed. In this step, the contact holes are formed in such a manner that the top surface of each of the gate electrode G1, the selecting gate electrode CG, the memory gate electrode MG, the gate electrode G4, and the diffusion regions D1 to D4 and DF is exposed from the interlayer insulating film IL. The silicide layer (not illustrated) is exposed at the bottom of the contact hole. The contact hole and the plug PG directly above each gate electrode are not illustrated in FIG. 16.

In formation of the plugs PG, a metal film mainly containing W (tungsten) is formed on the interlayer insulating film IL including the contact holes, and thereafter that metal film on the interlayer insulating film IL is polished to be removed, for example, by CMP. In this manner, the top surface of the interlayer insulating film IL is exposed. Thus, the plugs PG are formed which are formed by that metal film embedded in the respective contact holes. The plug PG is constituted by a multilayer film including a titanium nitride film that covers the side surface and the bottom surface of the contact hole and a tungsten film embedded in the contact hole via the titanium nitride film.

In subsequent steps, a plurality of wiring layers including wiring electrically coupled to the plug PG are stacked. By these steps, the semiconductor device of the present embodiment is approximately completed. The selecting transistor SW and the memory transistor MT are coupled in series to each other and constitute the memory cell MC (see FIG. 1) that is a non-volatile memory.

<Operation of Non-Volatile Memory>

An operation of a memory cell constituting the semiconductor device of the present embodiment is described below with reference to FIGS. 1, 2, and 22. FIG. 22 illustrates a table of an example of conditions for applying a voltage to each portion of a selected memory cell in each of the semiconductor devices according to the first to fourth embodiments. The selected memory cell described here refers to a memory cell selected as an object for which "writing", "erasing", or "reading" is performed.

The memory cell of the present embodiment is constituted by a selecting transistor and a memory transistor. The memory transistor has a MISFET structure in which a charge storage state in a charge holding film (trapping insulating film) in a gate insulating film of the MISFET is used as memory information that is to be read as a threshold value of the transistor. The charge holding film refers to an insulating film capable of storing charges therein. An example of the charge retaining film is a silicon nitride film. The threshold value of the MISFET is shifted by injection and discharge of the charges to/from such a charge storage region, thereby causing the MISFET to operate as a memory element. An example of a non-volatile semiconductor memory device using the charge holding film is a single-gate MONOS memory, such as the memory cell of the present embodiment.

The table in FIG. 22 shows, for each of a write operation and an erase operation, voltages respectively applied to the word lines WL1 and WL2, the bit lines BL1 and BL2, and the selecting lines SL1 and SL2 illustrated in FIG. 1 and the semiconductor substrate SB illustrated in FIG. 2 in "writing" and "erasing". In FIG. 22, the voltages applied to the word lines WL1 and WL2, the bit lines BL1 and BL2, and the selecting lines SL1 and SL2 and the semiconductor substrate SB illustrated in FIG. 2 are shown in columns WL1, WL2, BL1, BL2, SL1, SL2, and Sub, respectively. That is, a voltage applied to the word line WL1 is shown as a voltage WL1 and a voltage applied to the semiconductor substrate SB is shown as a voltage Sub, for example.

The word line WL1 is a wire for supplying a potential to the memory gate electrode MG in FIG. 2. The word line WL2 is a wire for supplying a potential to the selecting gate electrode CG in FIG. 2. The bit line BL1 or BL2 is a wire for supplying a drain potential to the drain region of the memory transistor MT in FIG. 2, that is, the extension region E3 and the diffusion region D3. The selecting line SL1 or SL2 is a wire for supplying a potential to the source region of the selecting transistor SW in FIG. 2, that is, the extension region ES and the diffusion region D2.

In FIG. 22, row A describes an application condition in writing in this first embodiment and a third embodiment described later, and row B describes an application condition in writing in a second embodiment described later. Row C describes an application condition in writing in a case where a fourth embodiment described later is applied to the first or third embodiment, and row D describes an application condition in writing in a case where the fourth embodiment is applied to the second embodiment. An application condition in erasing, described by row E, is applied to the first to fourth embodiments in common.

The voltage application conditions in the table in FIG. 22 are preferable examples. However, the voltage application condition is not limited thereto, but can be changed in various ways as necessary. Further, in the present embodiment, injection of electrons to the silicon nitride film N1 that is a charge storage portion in the ONO film ON of the memory transistor MT illustrated in FIG. 2 is defined as "writing", and injection of holes is defined as "erasing". A case is described here, in which a writing method is the FN (Fowler Nordheim) method and an erasing method is the FN method.

The FN method is an operation method in which writing or erasing is performed by tunneling of electrons or holes. In other words, writing in the FN method can be regarded as an operation method in which writing of a memory cell is performed by injecting electrons to the silicon nitride film N1 by the FN tunneling effect. Erasing in the FN method can be regarded as an operation method in which erasing of a memory cell is performed by injecting holes to the silicon nitride film N1 by the FN tunneling effect. Those operations are specifically described below.

In the write operation by the FN method, voltages shown in row A of the table in FIG. 22 (WL1=6.5 V, WL2=0 V, BL1=−2.5 V, BL2=2.0 V, SL1=−2.5 V, SL2=2.0 V, and Sub=0 V), for example, are applied to corresponding portions of a selected memory cell for which writing is performed, respectively. Thus, the memory cell transistor MT is turned on, and the memory cell MC located at the crossing of the word line WL1 and the bit line BL1 (the upper left memory cell MC in FIG. 1) is selected. An inversion layer is formed in the channel region of the memory transistor MT in an on state, and the channel potential is fixed to the potential of the bit line BL1.

Since there is a potential difference of about 9 V between the memory gate electrode MG of the memory transistor MT and the semiconductor layer SL electrically coupled to the bit line BL1 via the diffusion region D3, electrons in the semiconductor layer SL tunnel through the silicon oxide film OX1 and are stored to a trap level of the silicon nitride film N1 that is the charge storage film. Consequently, the threshold voltage of the memory transistor MT rises. The write operation is achieved by this FN tunneling phenomenon, so that the memory transistor MT enters to a write state.

In this write operation, the potential of the diffusion region DF shared by the selecting transistor SW with the memory transistor MT of the selected memory cell, that is, the potential of the drain region of the selecting transistor SW is the same potential (−2.5 V) as that of the bit line BL1, because the memory transistor MT is in the on state. In this example, by setting the potential of the selecting line SL1 to be applied to the source electrode of the selecting transistor SW to be the same potential (−2.5 V) as that of the bit line BL1, the selecting transistor SW is cut off. That is, the selecting transistor SW is in an off state in the write operation.

In order to prevent writing from being performed for an unselected memory cell MC (unselected bit) on the same word line WL1 as the selected memory cell MC (selected bit) in the write operation in the write operation, as illustrated in FIG. 1, the potential of the bit line BL2 is adjusted in such a manner that the potential difference between the word line WL1 and the bit line BL2 is smaller than the potential difference between the word line WL1 and the bit line BL1 in the selected memory cell. Further, in an unselected memory cell MC coupled to the same bit line as each of the selected memory cell MC and the unselected memory cell MC, disturb by weak writing and erasing is prevented by setting the word line WL1u to a negative potential.

In the erase operation by the FN method, voltages shown in row E of the table in FIG. 22 (WL1=−2.5 V, WL2=0 V, BL1=6.5 V, BL2=6.5 V, SL1=0 V, SL2=0 V, and Sub=0 V), for example, are applied to corresponding portions of a selected memory cell for which erasing is performed, respectively. Thus, the memory cell MC located at the crossing of the word line WL1 and the bit line BL1 (the upper left memory cell MC in FIG. 1) is selected.

Since there is a potential difference of about 9 V between the memory gate electrode MG of the memory transistor MT and the semiconductor layer SL electrically coupled to the bit line BL1 via the diffusion region D3, the electrons stored in the silicon nitride film N1 tunnel through the silicon oxide film OX1 and move into the semiconductor layer SL. In this manner, the electrons in the silicon nitride film N1 are drawn into the semiconductor layer SL, and holes are stored in the silicon nitride film Ni. Consequently, the threshold voltage of the memory transistor is lowered. In this manner, the erase operation is performed, so that the memory transistor MT enters an erase state.

In this erase operation, 0 V is applied to the selecting gate electrode CG of the selecting transistor SW of the selected memory cell. Therefore, the selecting transistor SW is in an off state. At this time, since the memory transistor MT is in an on state, the potential of the drain region including the extension region ED and the diffusion region DF of the selecting transistor SW is the same as the potential of the bit line BL1 (6.5 V).

In a read operation, 2.0 V is applied to the selecting gate electrode CG (word line WL2) of a selected memory cell for which reading is performed to turn on the selecting transistor SW, and 0.8 V is applied to the drain region (bit line BL1) of the memory transistor MT, for example. A voltage applied to the selecting line SL1 and the memory gate electrode MG (word line WL1) is 0 V, for example. Since the threshold voltage of the memory transistor MT is changed by the presence or absence of the charges stored in the silicon nitride film N1, it is possible to determine whether the memory transistor MT is in the write state or the erase state.

<Advantageous Effects of Semiconductor Device of Present Embodiment>

Figure 23:
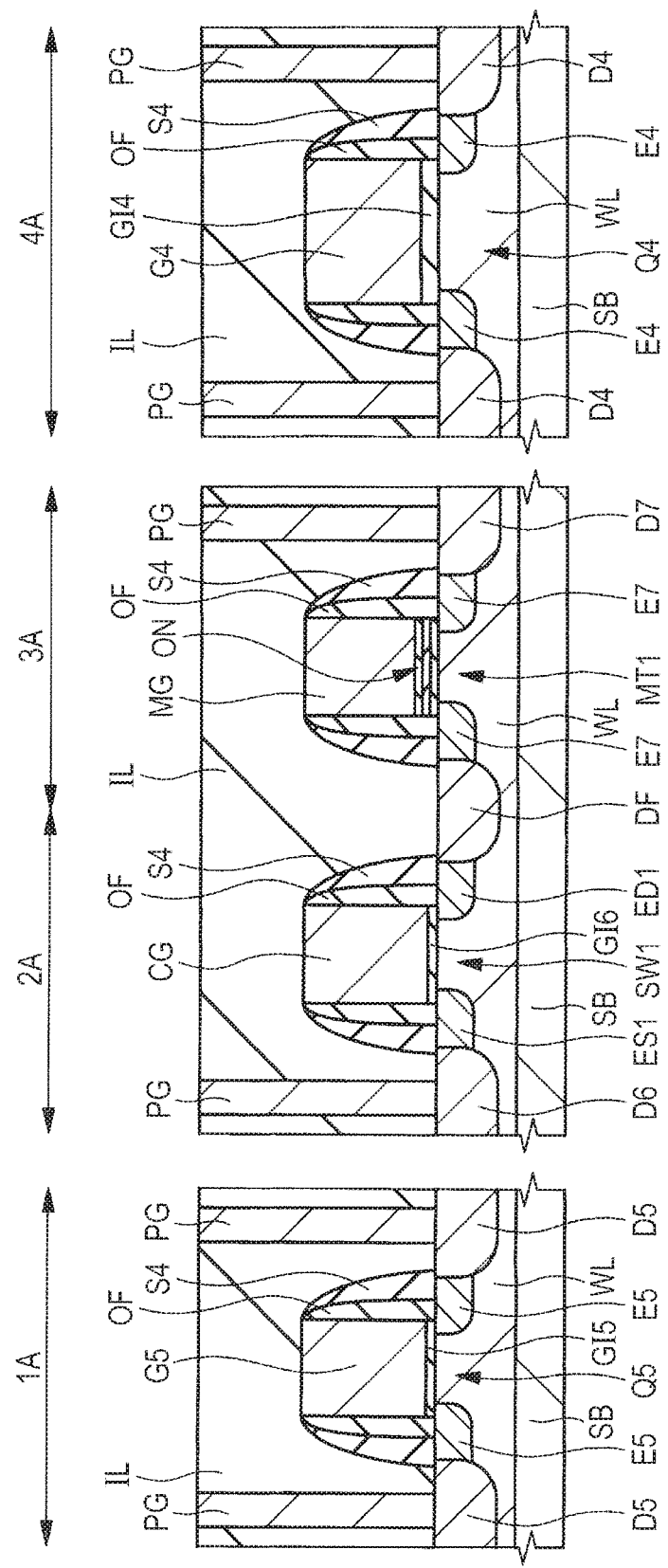
FIG. 23 is a cross-sectional view of a semiconductor device according to a comparative example.

Advantageous effects of the semiconductor device of the present embodiment are described below, by referring to a comparative example illustrated in FIG. 23. FIG. 23 is a cross-sectional view of a semiconductor device according to the comparative example. In FIG. 23, the low breakdown voltage transistor region 1A, the selecting transistor region 2A, the memory transistor region 3A, and the high breakdown voltage transistor region 4A are illustrated in that order from left, as in FIG. 2.

The semiconductor device of the comparative example illustrated in FIG. 23 does not include an SOI substrate (SOI region). A portion of an extension region of a selecting transistor overlaps a selecting gate electrode CG in a plan view. In these points, the semiconductor device of the comparative example is different from the semiconductor device of the present embodiment described above. Further, a side wall S4 is formed on a side surface of each gate electrode via the offset spacer OF.

That is, the semiconductor device of the comparative example illustrated in FIG. 23 includes a low breakdown voltage transistor Q5 formed in the low breakdown voltage transistor region 1A in a peripheral circuit region and the high breakdown voltage transistor Q4 formed in the high breakdown voltage transistor region 4A in an I/O region. Also, the semiconductor device of the comparative example constitutes a memory cell, and includes a selecting transistor SW1 and a memory transistor MT1 coupled in series to each other. All the low breakdown voltage transistor Q5, the selecting transistor SW1, the memory transistor MT1, and the high breakdown voltage transistor Q4 are elements formed on a bulk silicon substrate.

Therefore, extension regions E5 and diffusion regions D5 constituting source and drain regions of the low breakdown voltage transistor Q5 are formed in the main surface of the semiconductor substrate SB. Similarly, extension regions ES1 and ED1 and diffusion regions D6 and DF constituting source and drain regions of the selecting transistor SW1 are formed on the main surface of the semiconductor substrate SB. Similarly, extension regions E7 and a diffusion region D7 constituting source and drain regions of the memory transistor MT1 are formed on the main surface of the semiconductor substrate SB. Each diffusion region has the formation depth deeper than that of each extension region.

In a write operation of the semiconductor device of the comparative example, a voltage of −2.5 V, for example, is applied to the bit line BL1 (see FIG. 1), that is, the drain region of the memory transistor MT1 in a selected memory cell, and 6.5 V is applied to the word line WL1 (see FIG. 1), that is, the memory gate electrode MG of the memory transistor MT1. Also, in the memory transistor MT after erasing, electrons in the silicon nitride film N1 are reduced. Therefore, the threshold voltage is lowered. Thus, the memory transistor MT1 is in an on state. Accordingly, the potential of the bit line BL1 is transferred to the source region of the memory transistor MT1, and therefore the potential of the drain region of the selecting transistor SW1 is the same as the potential of the bit line BL1. Further, −2.5 V is applied to the source region of the selecting transistor SW1 in order to cut off the selecting transistor SW1. Furthermore, 0 V is applied to the selecting gate electrode CG of the selecting transistor SW1, for example.

In addition, in order to prevent increase of power consumption caused by generation of junction leak current between the source and drain regions in the selecting transistor SW1 and those in the memory transistor MT1, the same voltage as that of the source and drain regions (e.g., −2.5 V) is applied to the semiconductor substrate SB. In this case, it is necessary to prevent generation of leak current and occurrence of breakdown between the selecting gate electrode CG and the drain region of the selecting transistor SW1 and between the selecting gate electrode CG and the semiconductor substrate SB. Therefore, it is necessary that a gate insulating film GI6 has a predetermined thickness in order to ensure reliability of the gate insulating film GI6. In particular, in a write operation, an electric field can easily concentrate on an end of the gate insulating film GI6 on the side close to the drain region of the selecting transistor SW1 in the gate-length direction of the selecting gate electrode CG, and therefore breakdown can easily occur at that end.

In an erase operation of the semiconductor device of the comparative example, a voltage of 6.5 V, for example, is applied to the bit line BL1, that is, the drain region of the memory transistor MT1 in the selected memory cell, and −2.5 V is applied to the word line WL1, that is, the memory gate electrode MG of the memory transistor MT1. At this time, in order to prevent generation of junction leak current or gate induced drain leakage (GIDL) between the semiconductor substrate SB and the drain region of the memory transistor MT1, the same voltage as that of the drain region (for example, a substrate bias of 6.5 V) is applied to the semiconductor substrate SB. The gate induced drain leakage means that, when voltages of reverse polarities are applied to a gate electrode and a drain region, respectively, leak current flows between the gate electrode and the drain region.

Further, in order to prevent generation of junction leak current between the source region of the selecting transistor SW1 and the semiconductor substrate SB, the same voltage as that of the semiconductor substrate SB (for example, 6.5 V) is applied to that source region. Furthermore, 0 V is applied to the selecting gate electrode CG of the selecting transistor SW1, for example.

In this case, it is necessary to prevent generation of leak current and occurrence of breakdown between the selecting gate electrode CG and the source region of the selecting transistor SW1 and between the selecting gate electrode CG and the semiconductor substrate SB. Therefore, it is necessary that the gate insulating film GI6 has a predetermined thickness in order to ensure reliability of the gate insulating film GI6. In particular, in the erase operation, the electric field can easily concentrate on an end of the gate insulating film GI6 on the side close to the source region of the selecting transistor SW1 in the gate-length direction of the selecting gate electrode CG, and therefore breakdown can easily occur at that end.

Therefore, for the purpose of ensuring reliability of the gate insulating film GI6, it can be considered to form the thickness of the gate insulating film GI6 of the selecting transistor SW1 to be as large as the thickness (e.g., 8 nm) of the gate insulating film GI4 of the high breakdown voltage transistor Q4 that is an I/O element, as compared with the low breakdown voltage transistor Q1 that is required to operate at a high speed in order to constitute a CPU (Central Processing Unit). On the other hand, it is effective to reduce a voltage in a read operation for a memory cell, as one measure for achieving low power consumption. Therefore, in order to achieve low power consumption of a memory cell array, in the comparative example, miniaturization of the selecting transistor SW1 that enters an on state in the read operation is achieved, and the thickness of the gate insulating film GI6 of the selecting transistor SW1 is formed to be similar to the thickness (e.g., 3 nm) of the gate insulating film GI5 of the low breakdown voltage transistor Q5.

However, when the thickness of the gate insulating film GI6 of the selecting transistor SW1 is made thinner by this scaling (miniaturization), a problem arises that dielectric strength of the gate insulating film GI6 is lowered and therefore the life of a semiconductor device including the selecting transistor SW1 becomes short. This is because it is necessary in the memory cell array that voltages respectively applied to a word line and a bit line have a larger difference therebetween in terms of a relation between a write speed and an erase speed and reliability, such as retention, as compared with the low breakdown voltage transistor Q5 in the peripheral circuit region. For example, in the aforementioned voltage application condition, the potential difference between the word line and the bit line in the write operation and the erase operation is 9 V. Therefore, it is necessary for the gate insulating film GI6 to have dielectric strength of at least 9 V.

Therefore, in the semiconductor device of the present embodiment, the BOX film BX and the semiconductor layer SL are formed to form an SOI region in the low breakdown voltage transistor region 1A, the selecting transistor region 2A, and the memory transistor region 3A, as illustrated in FIG. 2, as the first feature. With this configuration, the low breakdown voltage transistor Q1, the selecting transistor SW, and the memory transistor MT that are formed on the semiconductor layer SL are insulated from the semiconductor substrate SB. Therefore, when a voltage is applied to the bit line BL1 (see FIG. 1) in a write operation and an erase operation, it is not necessary to make the semiconductor substrate SB and the bit line BL1 have the same potential as each other in order to prevent generation of leak current between the drain region of the memory transistor MT coupled to the bit line BL1 and the semiconductor substrate SB.

Accordingly, 0 V is applied to the semiconductor substrate SB in the write operation and the erase operation in the present embodiment. That is, it is possible to set a potential difference between the selecting gate electrode CG and the source region of the selecting transistor SW and a potential difference between the selecting gate electrode CG and the semiconductor substrate SB. Thus, it is possible to prevent reliability of the gate insulating film GI2 from being lowered because of the potential difference between the selecting gate electrode CG and the semiconductor substrate SB. Further, it is not necessary to apply 6.5 V, for example, to the semiconductor substrate SB in the erase operation, and therefore it is not necessary to apply 6.5 V to the source region of the selecting transistor SW coupled to the selecting line SL1 (see FIG. 1). Thus, the voltage applied to the source region is set to 0 V in the present embodiment (see FIG. 22). Accordingly, it is possible to prevent reliability of the gate insulating film GI2 from being lowered because of the potential difference between the source region of the selecting transistor SW and the selecting gate electrode CG in the erase operation.

Further, in the semiconductor device of the present embodiment, each of the extension regions ES and ED of the selecting transistor SW is arranged to recede from the selecting gate electrode CG as the second feature. With this feature, insulation resistance of the gate insulating film GI2 in the write operation is improved. That is, each of the extension regions ES and ED is away from the selecting gate electrode CG in the gate-length direction. Each of the extension regions ES and ED does not overlap the selecting gate electrode CG.

The maximum electric field in the gate insulating film GI2 in the write operation is rate-limited by a distance between the selecting gate electrode CG and the drain electrode of the selecting transistor SW, that is, a distance between the selecting gate electrode CG and the extension region ED. In the present embodiment, the extension region ED of the selecting transistor SW is formed to recede from the selecting gate electrode CG. Therefore, the maximum electric field in the gate insulating film GI2 in the write operation can be alleviated, so that insulation resistance of the gate insulating film GI2 can be improved. The maximum electric field in the gate insulating film GI2 in the write operation can be further alleviated by forming a depletion layer generated in the extension region ED to have a large width. This is described below.

In a case where a transistor is turned on and an inversion layer is formed below a gate electrode, resistance of a gate insulating film in the transistor and the maximum electric field in the gate insulating film are rate-limited mainly by the thickness of the gate insulating film. In a case where the transistor is an off state, however, an extension region becomes depleted and therefore the maximum electric field in the gate insulating film is rate-limited not only by the thickness of the gate insulating film but also by the width of its depletion layer.

The depletion layer in the case where the transistor is in the off state is generated to extend from a boundary (pn junction) between the extension region that is an n-type semiconductor region and a well that is a p-type semiconductor region to the inside of the extension region. The position of the depletion layer in the case where the transistor is in the off state recedes from the gate electrode more, as the impurity concentration of the extension region is lower. In other words, as the impurity concentration of the extension region is lower, the depletion layer in the case where the transistor is in the off state can more easily extend towards a diffusion region within the extension region.

In a case where the depletion layer is generated within the extension region, insulation resistance of the gate insulating film in the transistor in the off state becomes lower as the shortest distance between the gate electrode and portions of the source and drain regions, which do not overlap the depletion layer, becomes smaller. For the reasons described above, in the case where the transistor is in the off state, the depletion layer can easily extend within the extension region when the impurity concentration of the extension region is low. Therefore, as the impurity concentration of the extension region is lower, the maximum electric field in the gate insulating film is more alleviated.

In the present embodiment, by setting the impurity concentration of the extension region ED illustrated in FIG. 2 to be lower than that of the extension region E1, it is possible to prevent generation of leak current and occurrence of breakdown between the drain region of the selecting transistor SW and the selecting gate electrode CG when the selecting transistor SW is in an off state, that is, in the write operation. Therefore, it is possible to improve insulation resistance of the gate insulating film GI2 and to extend the life of the selecting transistor SW.

When the TDDB (Time Dependent Dielectric Breakdown) lives of transistors that are the same as each other in the thickness of a gate insulating film and impurity concentration of an extension region are compared with each other, the TDDB life of the transistor to which a voltage continues to be applied in an off state and be subjected to stress is extended, as compared with the transistor to which a voltage continues to be applied in an on state and be subjected to stress. Further, the TDDB life is further extended in the transistor having no extension region, in a case where that transistor continues to be subjected to stress in an off state.

Therefore, it is more effective in improvement of resistance of the gate insulating film to arrange the extension regions E1 and ED of the selecting transistor SW to recede from the selecting gate electrode CG, as compared with the extension region E1 of the low breakdown voltage transistor Q1 in the peripheral circuit region. For example, it is desirable to reduce the impurity concentrations of the extension regions ES and ED to about one half order of magnitude lower than the impurity concentration of the extension region E1 or less. For example, when a predetermined impurity concentration is $1\times10^{18}/cm^3$, the impurity concentration that is one half order of magnitude lower than that concentration or less means a concentration of $0.5\times10^{18}/cm^3$ or less. That is, "one half order of magnitude lower than . . . Or less" has the same meaning as "one half or less".

Meanwhile, in a case where a transistor constituting a memory cell is formed on an SOI substrate, an inversion layer is formed in the transistor in a write operation and the channel potential of the transistor is fixed to the potential of the bit line BL1 (see FIG. 1). Therefore, even when the transistor constituting the memory cell is formed on the SOI substrate, a write speed is not affected.

The channel potential of the transistor constituting the memory cell in an erase operation can easily "float", as compared with a case where a transistor of a memory cell is formed on a bulk silicon substrate. However, holes that are generated by BTBT (Band To Band Tunneling) directly below an end of a memory gate electrode when high-voltage erase stress is applied are immediately injected into an ONO film. Therefore, an erase speed is similar to that in the case where the transistor of the memory cell is formed on the bulk silicon substrate. Since the erase speed is rate-limited by a potential in a surface layer of the channel, effects of a potential on the BOX film side and a potential on the semiconductor substrate side on the erase speed are small. Therefore, with regard to a substrate potential in each of the write operation and the erase operation, it is desirable to set a voltage to be applied to each portion within such a range that an electric field between the semiconductor substrate and the bit line and an electric field between the semiconductor substrate and the selecting line are about 1 MV/cm or less, in order to ensure insulation reliability of the BOX film.

Further, the present embodiment describes a case where the low breakdown voltage transistor Q1 is formed on the SOI substrate. However, a main feature of the semiconductor device of the present embodiment is in the memory cell structure. Therefore, the low breakdown voltage transistor Q1 may be formed on the bulk silicon substrate as with the high breakdown voltage transistor Q4.

As described above, in the present embodiment, it is possible to achieve reduction of power consumption and miniaturization of a semiconductor device by making the gate insulating film GI2 of the selecting transistor SW thinner, and to improve reliability of the semiconductor device by ensuring insulation resistance of the gate insulating film GI2.

Second Embodiment

Figure 17:
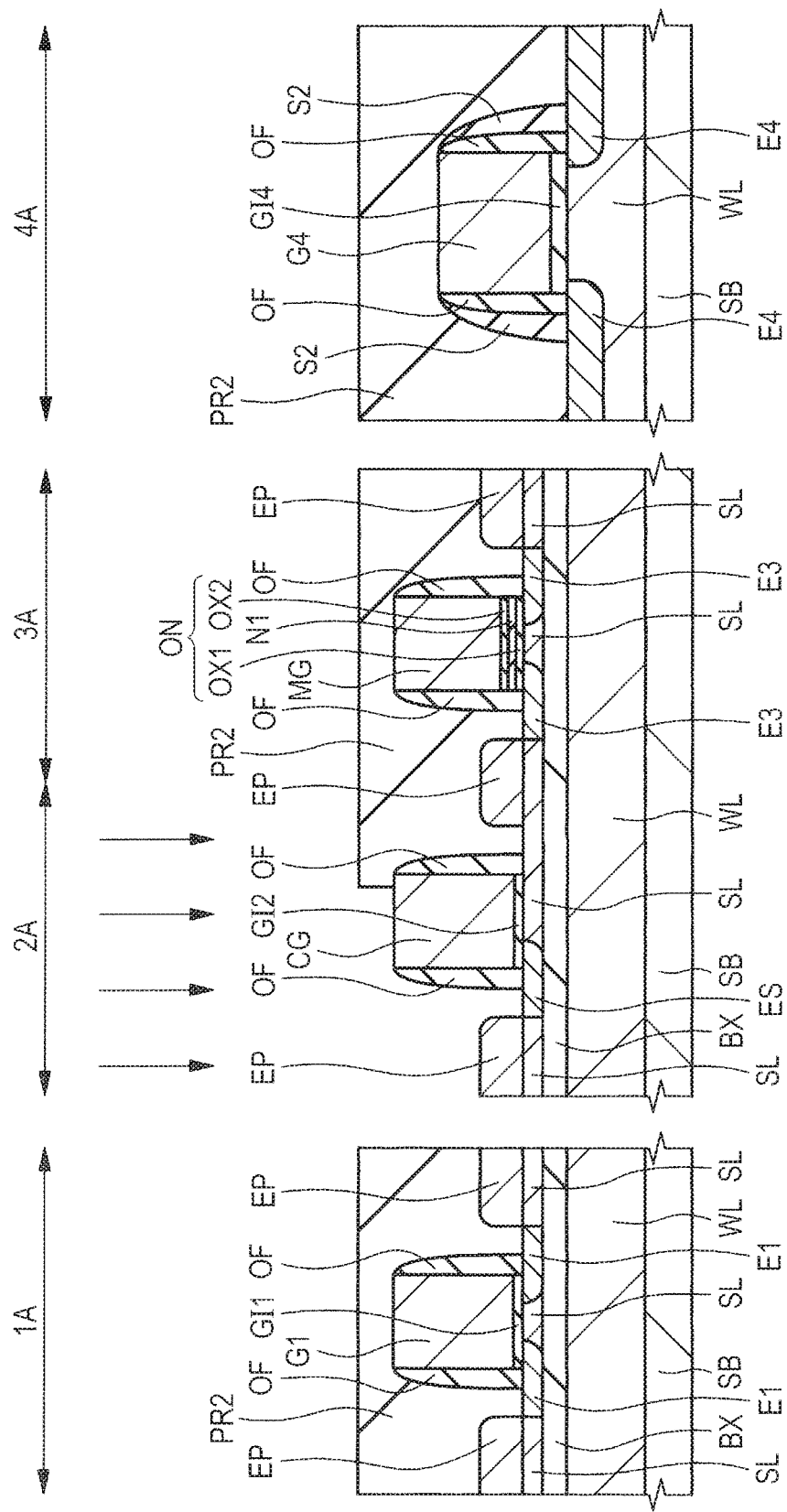
FIG. 17 is a cross-sectional view explaining a manufacturing step of a semiconductor device according to a second embodiment of the present invention.

In the following description, manufacturing steps of a semiconductor device of this second embodiment are described with reference to FIGS. 17 and 18, and the configuration of the semiconductor device of this second embodiment is described with reference to FIG. 18. In the present embodiment, a portion of a source region of a selecting transistor is formed to overlap a selecting gate electrode and a drain region of the selecting transistor is formed to be away from the selecting gate electrode in a plan view, unlike the first embodiment.

In the manufacturing steps of the semiconductor device of the present embodiment, the steps described with reference to FIGS. 3 to 13 are performed first. Then, the photoresist film PR1 is removed, and thereafter the photoresist film PR2 is formed which covers the low breakdown voltage transistor region 1A, the memory transistor region 3A, and the high breakdown voltage transistor region 4A, as illustrated in FIG. 17. The photoresist film PR2 covers a portion of the semiconductor layer SL and a portion of the epitaxial layer EP that are exposed from the selecting gate electrode CG and the offset spacer OF in the selecting transistor region 2A, the portions of the semiconductor layer SL and the epitaxial layer EP being located on a side of the selecting gate electrode CG which is closer to the memory transistor region 3A. That is, the semiconductor layer SL and the epitaxial layer EP in a region where the drain region of the selecting transistor is to be formed later is covered by the photoresist film PR2.

Then, n-type impurities (e.g., As (arsenic) or P (phosphorous)) are implanted into the top surface of the semiconductor layer SL in the selecting transistor region 2A by using the photoresist film PR2 as mask. In this manner, the extension region ES is formed in the semiconductor layer SL in the selecting transistor region 2A. Note that illustration of a semiconductor region formed by introduction of n-type impurities into the epitaxial layer EP is omitted. The extension region ES is formed in the semiconductor layer SL on a side of the selecting gate electrode CG which is opposite to the memory gate electrode MG side.

Unlike the aforementioned first embodiment, the impurity concentration of the extension region ES is made the same as that of the extension region E1, for example. Therefore, the extension region ES is diffused more widely in the semiconductor layer SL than the extension region ES of the aforementioned first embodiment. Thus, an end of the extension region ES reaches directly below the selecting gate electrode CG.

Figure 18:
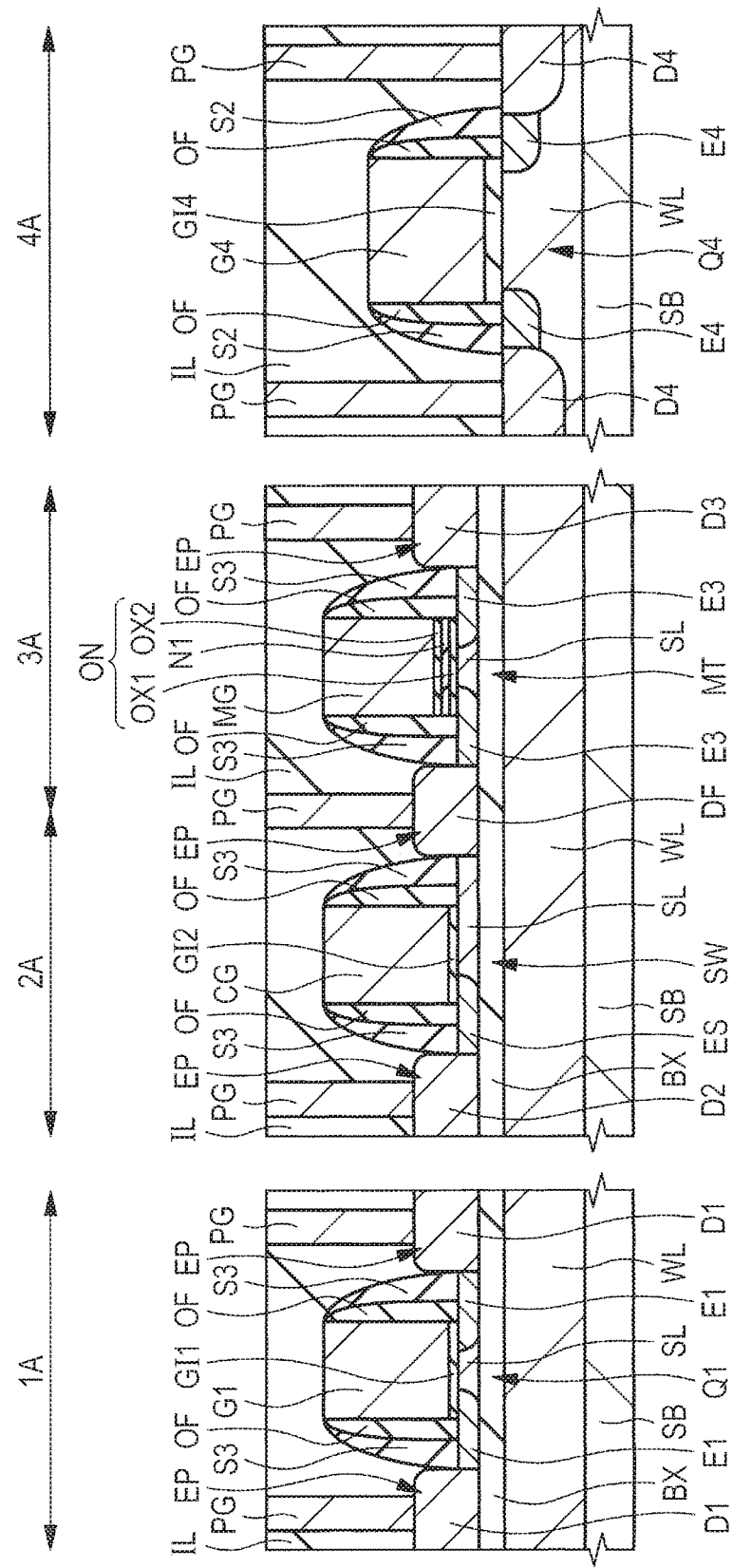
FIG. 18 is a cross-sectional view in a manufacturing step of the semiconductor device following FIG. 17.

Subsequently, the steps described with reference to FIGS. 15 and 16 are performed, thereby the semiconductor device of the present embodiment is almost completed, as illustrated in FIG. 18. In the present embodiment, the extension region ED (see FIG. 2) is not formed, unlike the first embodiment. That is, the drain region of the selecting transistor SW is formed by the diffusion region DF.

In the present embodiment, the selecting transistor SW and the memory transistor MT are formed on an SOI substrate, as in the first embodiment. Therefore, it is not necessary to make the semiconductor substrate SB and the source region of the selecting transistor SW have the same potential as the bit line BL1 (see FIG. 1) in order to prevent generation of junction leak current. Accordingly, it is possible to prevent generation of leak current and occurrence of breakdown between the semiconductor layer SL and the extension region ES, and the selecting gate electrode CG in an erase operation. That is, insulation resistance of the gate insulating film GI2 can be improved.

As described above, in the erase operation, it is possible to prevent insulation resistance of the gate insulating film GI2 from being lowered by a potential difference between the semiconductor layer SL and the extension region ES, and the selecting gate electrode CG. Therefore, insulation resistance can be improved. Accordingly, there is no problem even when the extension region ED is formed to be close to the selecting gate electrode CG to such an extent that the extension region ES overlaps the selecting gate electrode CG in a plan view.

Further, in the present embodiment, an extension region constituting the drain region of the selecting transistor SW is not formed, thereby arranging the selecting gate electrode CG and the drain region to be away from each other in a plan view. This configuration can prevent generation of leak current and occurrence of breakdown between the drain region and the selecting gate electrode CG in a write operation. That is, insulation resistance of the gate insulating film GI2 can be improved.

Examples of conditions of voltages to be applied to respective portions of a memory cell constituting the semiconductor device of the present embodiment during an operation are shown in the table of FIG. 22. The application condition in the write operation is shown in row B in FIG. 22. The application condition in the erase operation is shown in row E in FIG. 22. In this example, the potential applied to the selecting gate electrode CG, that is, the potential of the word line WL2 illustrated in FIG. 1 is made similar to the potentials of the selecting lines SL1 and SL2 and the bit line BL1 in the write operation. Alternatively, the potential of the word line WL2 can be set within a range in which a potential difference between the potential of the word line WL2 and that of the selecting line SL1 or SL2 or the bit line BL1 allows sufficient gate insulation resistance to be ensured. With this configuration, all problems related to a gate breakdown voltage of a selected memory cell MC are avoided.

Note that in an unselected memory cell MC coupled to the word line WL2, the potential of the bit line BL2 is set to be higher than that of the bit line BL1 in order to prevent writing. Therefore, a potential difference between the word line WL2 and the bit line BL2 in that unselected memory cell MC becomes larger than that in the first embodiment. On the other hand, factors of rate-limiting the gate breakdown voltage can be aggregated into the potential difference between the word line WL2 and the bit line BL2.

Third Embodiment

Figure 19:
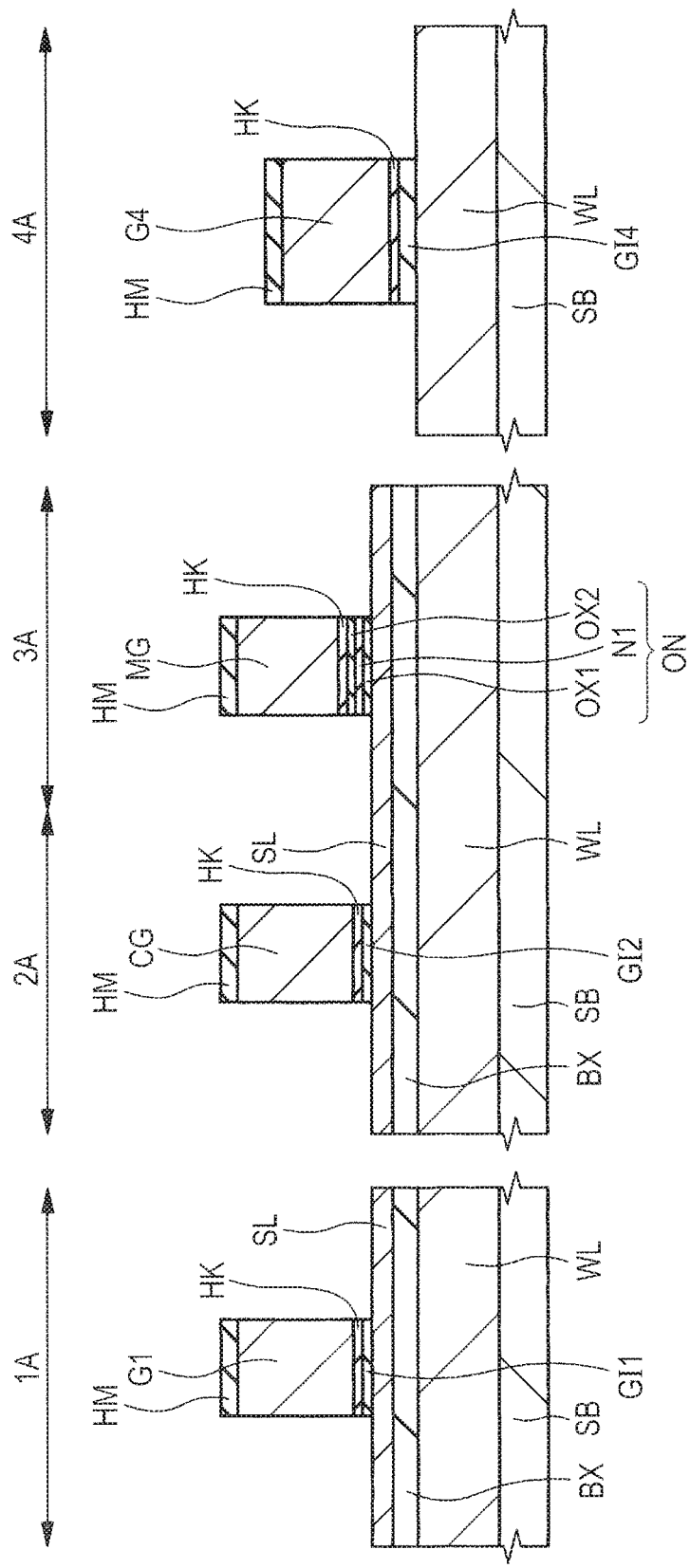
FIG. 19 is a cross-sectional view explaining a manufacturing step of a semiconductor device according to a third embodiment of the present invention.

In the following description, manufacturing steps of a semiconductor device of this third embodiment are described with reference to FIGS. 19 and 20, and the configuration of the semiconductor device of this third embodiment is described with reference to FIG. 20. In the present embodiment, a high dielectric film (hereinafter, simply referred to as a high-k film) is formed between each of gate insulating films including an ONO film and a corresponding gate electrode, unlike the aforementioned first embodiment.

In the manufacturing steps of the semiconductor device according to the present embodiment, the steps described with reference to FIGS. 3 to 7 are performed first. Then, an insulating film is formed by thermal oxidation, for example, to cover the top surface of the ONO film ON in the memory transistor region 3A, the top surface of the semiconductor layer SL in the low breakdown voltage transistor region 1A and the selecting transistor region 2A, and the top surface of the insulating film IF2 in the high breakdown voltage transistor region 4A, as illustrated in FIG. 19. Subsequently, a high-k film HK, a silicon film, and a silicon nitride film are formed on the entire main surface of the semiconductor substrate SB in order by CVD, for example. That silicon nitride film is then processed, thereby forming a hard mask HM formed by the silicon nitride film. Thereafter, etching is performed by using the hard mask HM as an etching protection film to remove a portion of each the above silicon film, the high-k film HK, the ONO film ON, the above insulating film, and the insulating film IF2.

Thus, in the low breakdown voltage transistor region 1A, a multilayer pattern is formed on the semiconductor layer SL, which is formed by the gate insulating film GI1 formed by the above insulating film, the high-k film HK, the gate electrode G1 formed by the above silicon film, and the hard mask HM. Further, in the selecting transistor region 2A, a multilayer pattern is formed on the semiconductor layer SL, which is formed by the gate insulating film GI2 formed by the above insulating film, the high-k film HK, the selecting gate electrode CG formed by the above silicon film, and the hard mask HM. Furthermore, in the memory transistor region 3A, a multilayer pattern is formed on the semiconductor layer SL, which is formed by the ONO film ON, the high-k film HK, the memory gate electrode MG formed by the above silicon film, and the hard mask HM. In the high breakdown voltage transistor region 4A, a multilayer pattern is formed on the semiconductor substrate SB, which is formed by the gate insulating film GI4 formed by the above insulating film and the insulating film IF2, the high-k film HK, the gate electrode G4 formed by the above silicon film, and the hard mask HM.

As described above, unlike the step described with reference to FIG. 8 in the description of the manufacturing steps of the semiconductor device of the aforementioned first embodiment, the high-k film HK is formed between the gate insulating film GI1 and the gate electrode G1, between the gate insulating film GI2 and the selecting gate electrode CG, between the ONO film ON and the memory gate electrode MG, and between the gate insulating film GI4 and the gate electrode G4 in the present embodiment. The high-k film HK is formed by an insulating film with a higher dielectric constant than silicon oxide and silicon nitride, and is formed by a film containing Hf (hafnium) or Al (aluminum), for example.

Figure 20:
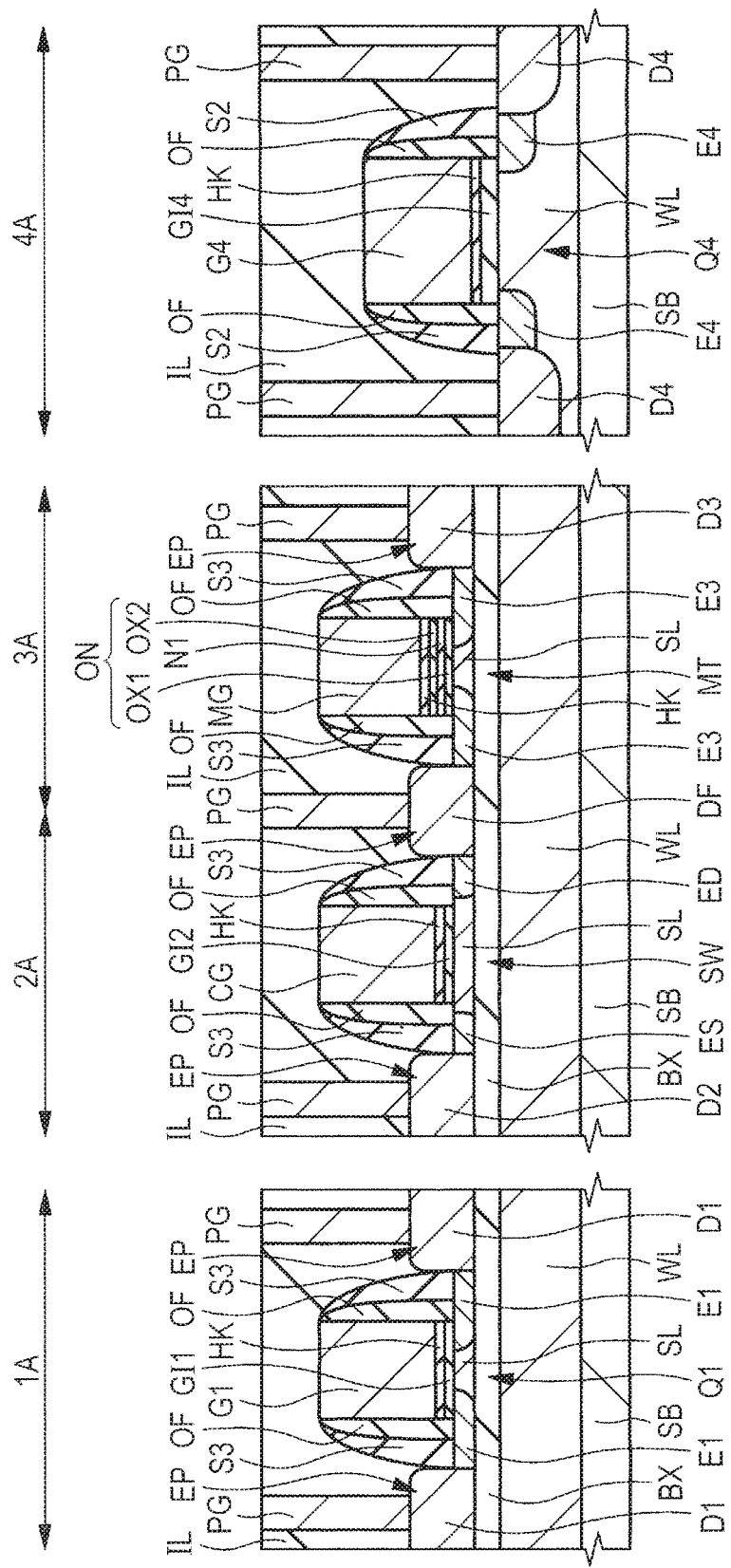
FIG. 20 is a cross-sectional view in a manufacturing step of the semiconductor device following FIG. 19.

Subsequently, steps similar to the steps described with reference to FIGS. 9 to 16 are performed, thereby the semiconductor device of the present embodiment is almost completed, as illustrated in FIG. 20. In the present embodiment, by forming the high-k film HK, a dielectric constant of a gate insulating film including the ONO film ON and the high-k film HK in the memory transistor region 3A increases. Therefore, the speeds of a write operation and an erase operation increase, so that a memory operation voltage can be reduced. Further, due to reduction of the memory operation voltage, the potential difference between the potential of the word line WL1 applied to the selecting transistor SW of an unselected memory cell and the bit line BL2 can be reduced. Therefore, margin of gate insulating resistance can be made wider than that in the aforementioned first embodiment.

Note that a voltage application condition for the semiconductor device of the present embodiment is the same as that in the aforementioned first embodiment, as illustrated in FIG. 22.

Fourth Embodiment

An operation method of a semiconductor device of the present embodiment is described below, with reference to FIG. 21. The present embodiment is directed to a method for applying a voltage to a semiconductor device, which can be applied to the semiconductor device of each of the aforementioned first to third embodiments, and particularly has a feature in a voltage applied to a semiconductor substrate. A case where a voltage application condition of the present embodiment is applied to the semiconductor device of the aforementioned first embodiment is mainly described below.

Figure 21:
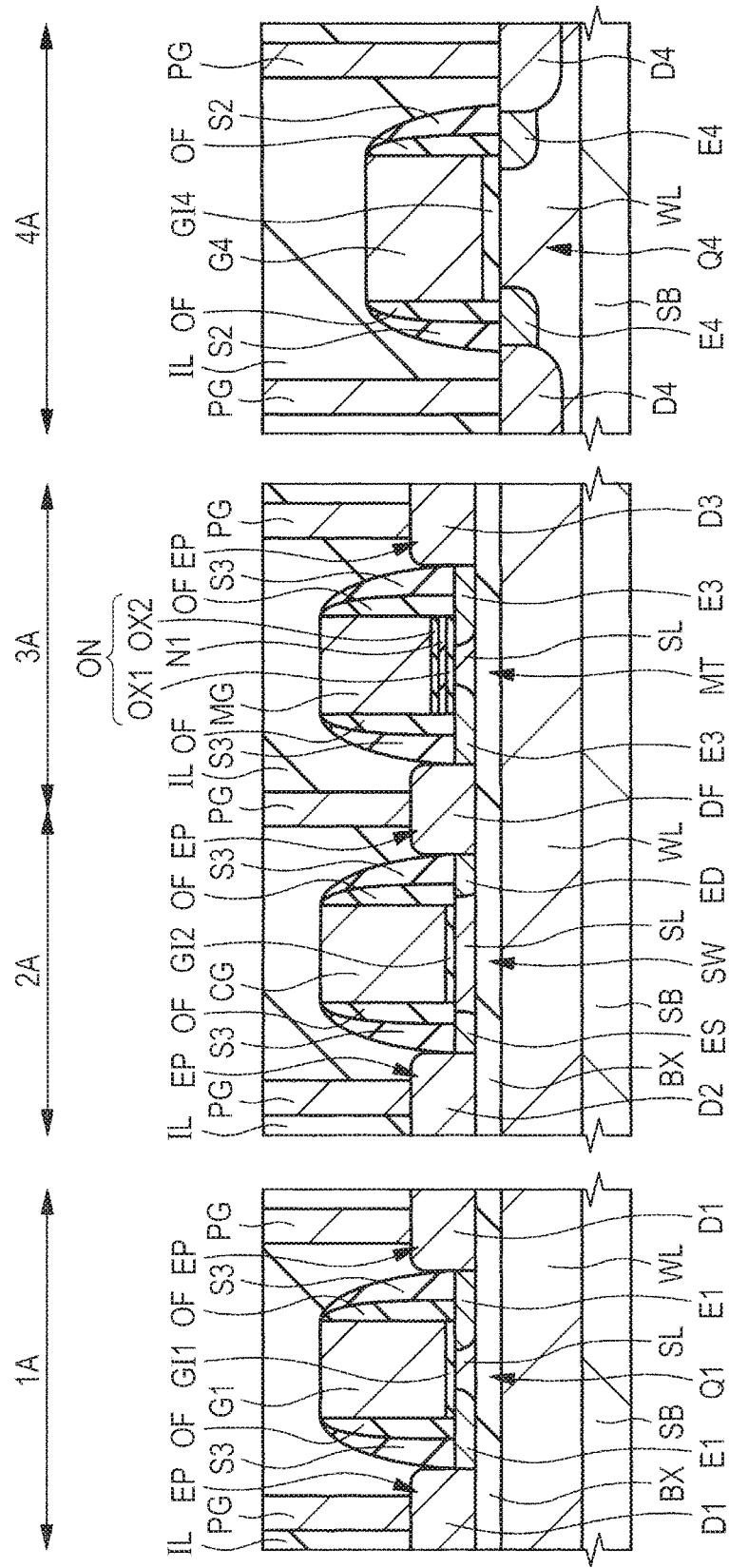
FIG. 21 is a cross-sectional view of a semiconductor device according to a fourth embodiment of the present invention.

As illustrated in FIG. 21, the configuration of the semiconductor device of the present embodiment is similar to the configuration of the semiconductor device of the aforementioned first embodiment illustrated in FIG. 2. However, the thickness of each of the BOX film BX and the semiconductor layer SL is thin and an SOI substrate in the present embodiment has an FDSOI structure. The voltage application condition for the semiconductor device of the present embodiment is shown in row C in FIG. 22. That is, −2.5 V, for example, is applied to the semiconductor substrate SB in a write operation, unlike the aforementioned first embodiment.

In the present embodiment, the channel potential of the selecting transistor SW can be controlled by applying the voltage to the BOX film BX via the semiconductor substrate SB. That is, in the present embodiment, a counter bias is applied to the BOX film BX via the semiconductor substrate SB in order to enhance an off state of the selecting transistor SW in the write operation. The counter bias is a voltage with a reverse polarity with respect to the voltage of the word line WL1 of a selected memory cell. The counter bias is a negative potential in a case where the selecting transistor SW is an n-channel transistor, and is a positive potential in a case where the selecting transistor SW is a p-channel transistor. By applying the above counter bias to the BOX film BX in the semiconductor film of the aforementioned first embodiment, it is possible to make the position of a depletion layer in the extension region ED of the selecting transistor SW further recede from the selecting gate electrode CG in an electrical manner. Thus, the advantageous effects of the aforementioned first embodiment can be obtained more significantly.

Note that the SOI substrate of the present embodiment has to use an FDSOI structure in order to allow the counter bias to affect a surface layer in the channel of the selecting transistor SW. That is, the source and drain regions of the selecting transistor SW are formed from the top surface to the bottom surface of the semiconductor layer SL, and a depletion layer is generated from the top surface to the bottom surface of the semiconductor layer SL in an operation of the selecting transistor SW. That is, the selecting transistor SW of the semiconductor device of the present embodiment is a fully depleted transistor.

As shown in row C in FIG. 22, it is necessary that an electric field between the voltage Sub of the semiconductor substrate SB and each bit line and an electric field between the voltage Sub and each selecting line is 1 MV/cm or less in order to ensure insulation resistance of the BOX film BX. However, the extending amount of extension of the depletion layer in the extension region ED is saturated with respect to the potential (voltage Sub) of the semiconductor substrate. Therefore, it is desirable that the voltage Sub is approximately the same as the voltage of the bit line BL1.

The operation method, that is, the voltage application method of the semiconductor device of the present embodiment can be applied not only to the aforementioned first embodiment but also to the aforementioned second and third embodiments. The application condition in a case where this operation method is applied to the aforementioned third embodiment is shown in row C in FIG. 22, and the application condition in a case where this operation method is applied to the aforementioned second embodiment is shown in row D in FIG. 22. When the present embodiment is applied to the semiconductor device of each of the aforementioned first to third embodiments, insulation resistance of the gate insulating film GI2 of the selecting transistor can be further improved by a counter bias.

In the above, the invention made by the inventors of the present application has been specifically described by way of the embodiments. However, it is naturally understood that the present invention is not limited to the aforementioned embodiments, and can be changed in various ways within the scope not departing from the gist thereof.

What is claimed is:

1. A semiconductor device, comprising:
   a semiconductor substrate including a first region, a second region, a third region, and a fourth region in a main surface thereof;
   a first semiconductor layer formed over the semiconductor substrate via a first insulating film in the third region and the fourth region;
   a first transistor formed over the semiconductor substrate in the first region;
   a second transistor formed over the semiconductor substrate in the second region;
   a third transistor formed over the first semiconductor layer in the third region; and
   a fourth transistor formed over the semiconductor substrate in the fourth region,
   wherein the first transistor includes a first gate electrode formed over the semiconductor substrate via a first gate insulating film,
   wherein the second transistor includes:
      a second gate electrode formed over the first semiconductor layer via a second gate insulating film; and
      a second source region and a second drain region formed to sandwich the first semiconductor layer directly below the second gate electrode,
   wherein the third transistor includes:
      a third gate electrode formed over the first semiconductor layer via a third gate insulating film that includes a charge storage portion; and
      a third source region and a third drain region formed to sandwich the first semiconductor layer directly below the third gate electrode,
   wherein the fourth transistor includes a fourth gate electrode formed over the semiconductor substrate via a fourth gate insulating film,
   wherein a thickness of each of the first gate insulating film and the second gate insulating film is smaller than a thickness of the fourth gate insulating film,
   wherein the second drain region and the third source region are electrically coupled to each other, and
   wherein the second drain region is away from the second gate electrode in a plan view.

2. The semiconductor device according to claim 1, wherein the second source region is away from the second gate electrode in the plan view.

3. The semiconductor device according to claim 1, further comprising:
   the first semiconductor layer formed over the semiconductor substrate via the first insulating film in the first region; and
   a first source region and a first drain region that are formed in the first semiconductor layer and constitute the first transistor,
   wherein each of the first source region and the first drain region includes:
      a first semiconductor region with a first conductive type; and
      a second semiconductor region with the first conductive type that is formed on a side of the first semiconductor region, which is close to the first gate electrode, and has an impurity concentration of the first conductive type lower than that in the first semiconductor region,
   wherein the second drain region includes:
      a fifth semiconductor region with the first conductive type; and a sixth semiconductor region with the first conductive type that is formed on a side of the fifth semiconductor region, which is close to the second gate electrode, and has an impurity concentration of the first conductive type lower than that in the fifth semiconductor region, and wherein the impurity concentration of the first conductive type in the sixth semiconductor region is lower than the impurity concentration of the first conductive type in the second semiconductor region.

4. The semiconductor device according to claim 3, wherein a value of the impurity concentration of the first conductive type in the sixth semiconductor region is half a value of the impurity concentration of the first conductive type in the second semiconductor region or less.

5. The semiconductor device according to claim 1, wherein the second transistor comprises a fully depleted electric field transistor.

6. The semiconductor device according to claim 1, wherein a thickness of the first insulating film is 30 nm or less, and wherein a thickness of the first semiconductor layer is 20 nm or less.

7. The semiconductor device according to claim 1, wherein the second source region includes:
a third semiconductor region of a first conductive type; and
a fourth semiconductor region of the first conductive type that is formed on a side of the third semiconductor region, which is close to the second gate electrode, and has an impurity concentration of the first conductive type lower than that in the third semiconductor region,
wherein the second drain region includes:
a fifth semiconductor region of the first conductive type; and
a sixth semiconductor region of the first conductive type that is formed on a side of the fifth semiconductor region, which is close to the second gate electrode, and has an impurity concentration of the first conductive type lower than that in the fifth semiconductor region, and
wherein each of the fourth semiconductor region and the sixth semiconductor region is formed from a top surface to a bottom surface of the first semiconductor layer.

8. The semiconductor device according to claim 1, further comprising a plurality of second semiconductor layers formed over the first semiconductor layer to sandwich each of the second gate electrode and the third gate electrode,
wherein the second source region includes:
a third semiconductor region of a first conductive type; and
a fourth semiconductor region of the first conductive type that is formed on a side of the third semiconductor region, which is close to the second gate electrode, and has an impurity concentration of the first conductive type lower than that in the third semiconductor region,
wherein the second drain region includes:
a fifth semiconductor region of the first conductive type; and
a sixth semiconductor region of the first conductive type that is formed on a side of the fifth semiconductor region, which is close to the second gate electrode, and has an impurity concentration of the first conductive type lower than that in the fifth semiconductor region, wherein the third source region includes:
the fifth semiconductor region; and
a seventh semiconductor region of the first conductive type that is formed on a side of the fifth semiconductor region, which is close to the third gate electrode, and has an impurity concentration of the first conductive type lower than that in the fifth semiconductor region,
wherein the third drain region includes:
an eighth semiconductor region of the first conductive type; and
a ninth semiconductor region of the first conductive type that is formed on a side of the eighth semiconductor region, which is close to the third gate electrode, and has an impurity concentration of the first conductive type lower than that in the eighth semiconductor region, and
wherein the third semiconductor region, the fifth semiconductor region, and the eighth semiconductor region are formed from top surfaces of the second semiconductor layers to extend within the first semiconductor layer.

9. The semiconductor device according to claim 1, wherein a portion of the second source region overlaps the second gate electrode in the plan view.

10. The semiconductor device according to claim 1, wherein a second insulating film having a higher dielectric constant than silicon nitride is formed between the third gate insulating film and the third gate electrode.

11. The semiconductor device according to claim 1, wherein the third transistor comprises a memory transistor that performs a write operation and an erase operation in accordance with a Fowler Nordheim (FN) method.

12. An operation method of a semiconductor device that includes:
a semiconductor substrate including a first region, a second region, a third region, and a fourth region in a main surface thereof;
a first semiconductor layer formed over the semiconductor substrate via a first insulating film in the third region and the fourth region;
a first transistor formed over the semiconductor substrate in the first region;
a second transistor formed over the semiconductor substrate in the second region;
a third transistor formed over the first semiconductor layer in the third region; and
a fourth transistor formed over the semiconductor substrate in the fourth region,
wherein the first transistor includes a first gate electrode formed over the semiconductor substrate via a first gate insulating film,
wherein the second transistor includes:
a second gate electrode formed over the first semiconductor layer via a second gate insulating film; and
a second source region and a second drain region formed to sandwich the first semiconductor layer directly below the second gate electrode,
wherein the third transistor includes:
a third gate electrode formed over the first semiconductor layer via a third gate insulating film that includes a charge storage portion; and
a third source region and a third drain region faulted to sandwich the first semiconductor layer directly below the third gate electrode, wherein the fourth transistor includes a fourth gate electrode formed over the semiconductor substrate via a fourth gate insulating film, wherein a thickness of each of the first gate insulating film and the second gate insulating film is smaller than a thickness of the fourth gate insulating film, wherein the second drain region and the third source region are electrically coupled to each other, wherein the second drain region is away from the second gate electrode in a plan view, wherein the third transistor is a memory transistor that performs a write operation in accordance with a Fowler Nordheim (FN)method, and wherein the second transistor comprises a fully depleted electric field transistor, the method comprising:

applying a first voltage to the second gate electrode in the write operation for the third transistor and applying a second voltage with an opposite polarity to that of the first voltage, to the semiconductor substrate.

13. The operation method of the semiconductor device according to claim 12, wherein the second source region is away from the second gate electrode in the plan view.

14. The operation method of the semiconductor device according to claim 12, wherein a second insulating film having a higher dielectric constant than silicon nitride is formed between the third gate insulating film and the third gate electrode.

15. The operation method of the semiconductor device according to claim 12, wherein a thickness of the first insulating film is 30 nm or less, and wherein a thickness of the first semiconductor layer is 20 nm or less.

* * * * *